United States Patent
Hsu et al.

(10) Patent No.: US 10,162,260 B2
(45) Date of Patent: Dec. 25, 2018

(54) PHOTOSENSITIVE RESIN COMPOSITION, PROTECTIVE FILM, AND LIQUID CRYSTAL DISPLAY ELEMENT

(71) Applicant: Chi Mei Corporation, Tainan (TW)

(72) Inventors: Chih-Hang Hsu, Kaohsiung (TW); Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 2 days.

(21) Appl. No.: 15/371,226

(22) Filed: Dec. 7, 2016

(65) Prior Publication Data

US 2017/0168390 A1 Jun. 15, 2017

(30) Foreign Application Priority Data

Dec. 14, 2015 (TW) .............................. 104141864 A

(51) Int. Cl.

| G03F 7/023 | (2006.01) |
|---|---|
| G03F 7/022 | (2006.01) |
| C08F 220/06 | (2006.01) |
| C08F 220/28 | (2006.01) |
| G03F 7/039 | (2006.01) |
| G03F 7/16 | (2006.01) |
| G03F 7/20 | (2006.01) |
| G03F 7/32 | (2006.01) |
| G03F 7/40 | (2006.01) |
| C08F 2/48 | (2006.01) |
| C08F 230/08 | (2006.01) |
| G03F 7/075 | (2006.01) |
| G02F 1/1333 | (2006.01) |
| G02F 1/1335 | (2006.01) |

(52) U.S. Cl.
CPC .............. *G03F 7/0233* (2013.01); *C08F 2/48* (2013.01); *C08F 220/06* (2013.01); *C08F 220/28* (2013.01); *C08F 230/08* (2013.01); *G03F 7/0226* (2013.01); *G03F 7/0392* (2013.01); *G03F 7/0758* (2013.01); *G03F 7/16* (2013.01); *G03F 7/168* (2013.01); *G03F 7/20* (2013.01); *G03F 7/327* (2013.01); *G03F 7/40* (2013.01); *C08F 2220/282* (2013.01); *G02F 1/1333* (2013.01); *G02F 1/1335* (2013.01); *G02F 2201/50* (2013.01)

(58) Field of Classification Search
CPC .............................. G03F 7/0233; G03F 7/0226
USPC .......................... 430/18, 165, 191, 192, 193
See application file for complete search history.

(56) References Cited

U.S. PATENT DOCUMENTS

| 2003/0134222 A1* | 7/2003 | Lee ....................... G03F 7/0233 |
| | | 430/191 |
| 2009/0191386 A1* | 7/2009 | Takahashi ............. G03F 7/0007 |
| | | 428/195.1 |
| 2015/0031808 A1 | 1/2015 | Huang et al. |
| 2015/0293449 A1* | 10/2015 | Wu ....................... G03F 7/0233 |
| | | 430/281.1 |
| 2015/0323868 A1* | 11/2015 | Huang ................. C09D 183/06 |
| | | 430/281.1 |

FOREIGN PATENT DOCUMENTS

| JP | 2001316474 | 11/2001 |
| JP | 2003207891 | 7/2003 |
| JP | 2005146131 | 6/2005 |
| JP | 2007226214 | 9/2007 |
| JP | 2008-107529 | 5/2008 |
| JP | 2014062978 | 4/2014 |
| JP | 2015108829 | 6/2015 |
| TW | 201209518 | 3/2012 |
| WO | 2011142391 | 7/2013 |
| WO | 2015137438 | 9/2015 |

OTHER PUBLICATIONS

"Office Action of Japan Counterpart Application," dated Oct. 17, 2017, p. 1-p. 3.
"Office Action of Taiwan Counterpart Application," dated Oct. 25, 2017, p. 1-p. 7.

* cited by examiner

*Primary Examiner* — John S Chu
(74) *Attorney, Agent, or Firm* — JCIPRNET

(57) ABSTRACT

The invention shows a photosensitive resin composition which can be used in protective film and liquid crystal display element and provides good transparency and high chemical resistance. The composition includes a complex resin (A), an o-naphthoquinone diazide sulfonate (B), and a solvent (C). The complex resin (A) includes a main chain and a side chain. The main chain includes a repeating unit derived from siloxane (meth)acrylate based monomer (a1-2). The side chain includes a repeating unit derived from siloxane based monomer (a2), and is bonded to the repeating unit derived from siloxane (meth)acrylate based monomer (a1-2). The complex resin (A) satisfies at least one of the following conditions (I) and (II):

Condition (I): the main chain further includes a repeating unit derived from unsaturated monomer (a1-1) including a carboxylic acid or a carboxylic anhydride.

Condition (II): the siloxane based monomer (a2) includes a monomer (a2-1) represented by formula (A-4).

9 Claims, No Drawings

PHOTOSENSITIVE RESIN COMPOSITION, PROTECTIVE FILM, AND LIQUID CRYSTAL DISPLAY ELEMENT

CROSS-REFERENCE TO RELATED APPLICATION

This application claims the priority benefit of Taiwan application serial no. 104141864, filed on Dec. 14, 2015. The entirety of the above-mentioned patent application is hereby incorporated by reference herein and made a part of this specification.

BACKGROUND OF THE INVENTION

Field of the Invention

The invention relates to a photosensitive resin composition, a protective film, and an element having protective film. More particularly, the invention relates to a photosensitive resin composition capable of forming a protective film having good transparency and chemical resistance, a protective film formed by the photosensitive resin composition, and a liquid crystal display element containing the protective film.

Description of Related Art

In recent years, in the field of the semiconductor industry, liquid crystal displays (LCDs) and organic electro-luminescence displays (OELDs), with the size reduction, the demand of the miniaturization of the pattern(s) in the photolithography process is increased. Generally, the finer pattern is formed by exposing and developing a positive photosensitive material having high resolution and high sensitivity; wherein, a positive photosensitive material using a polysiloxane polymer as a component has become the mainstream used in the industry.

Japanese Laid-Open No. 2008-107529 discloses a photosensitive resin composition which can form a cured film of a high degree of transparency. A polysiloxane polymer containing an oxetanyl group or an oxydicarbonyl group is used in the composition. A hydrophilic structure is formed during copolymerization by a ring opening reaction. Although the photosensitive resin composition has a high solubility in the dilute alkaline developer, the chemical resistance of such photosensitive resin composition is poor, and is not acceptable by the industry.

Therefore, it is desirable for the industry to seek a photosensitive resin composition to provide both good transparency and chemical resistance.

SUMMARY OF THE INVENTION

Accordingly, the invention provides a photosensitive resin composition for liquid crystal display element, which can improve the problem of poor transparency and chemical resistance of conventional protective film.

The invention provides a photosensitive resin composition including a complex resin (A), an o-naphthoquinone diazide sulfonate (B), and a solvent (C). The complex resin (A) includes a main chain and a side chain. The main chain includes a repeating unit derived from siloxane (meth) acrylate based monomer (a1-2); and the side chain includes a repeating unit derived from siloxane based monomer (a2), and is bonded to the repeating unit derived from siloxane (meth)acrylate based monomer (a1-2). The complex resin (A) satisfies at least one of the following conditions (I) and (II):

Condition (I): the main chain further includes a repeating unit derived from unsaturated monomer (a1-1) including a carboxylic acid or a carboxylic anhydride, the unsaturated monomer (a1-1) including a carboxylic acid or a carboxylic anhydride includes a carboxylic acid group structure and an unsaturated bond, or includes a carboxylic anhydride group structure and an unsaturated bond.

Condition (II): the siloxane based monomer (a2) includes a monomer (a2-1) represented by the following formula (A-4).

$$Si(R^7)_w(OR^8)_{4-w} \quad \text{formula (A-4)}$$

In formula (A-4), $R^7$ represents a structure represented by the following formula (A-5), formula (A-6) or formula (A-7), or a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group, wherein at least one $R^7$ represents a structure represented by the following formula (A-5), formula (A-6) or formula (A-7); $R^8$ represents a hydrogen atom, a $C_1$ to $C_6$ hydrocarbon group, a $C_1$ to $C_6$ acyl group, or a $C_6$ to $C_{15}$ aryl group; when there are 2 or more $R^7$ or $R^8$ in the formula (A-4), each $R^7$ or $R^8$ can be the same or different; and w represents an integer of 1 to 3.

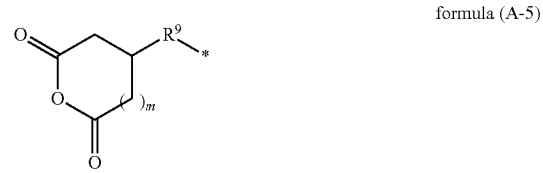

formula (A-5)

In formula (A-5), $R^9$ represents a $C_1$ to $C_{10}$ hydrocarbon group; m is 0 or 1; * represents a bonding site.

formula (A-6)

In formula (A-6), $R^{10}$ represents a single bond, a $C_1$ to $C_{10}$ alkyl group or a $C_1$ to $C_{10}$ alkoxy group; $R^{11}$ represents a hydrogen atom or a $C_1$ to $C_{10}$ hydrocarbon group; n is 0 or 1; * represents a bonding site.

formula (A-7)

In formula (A-7), $R^{12}$ represents a single bond or a $C_1$ to $C_6$ alkylene group; * represents a bonding site.

In an embodiment of the invention, the main chain further includes a repeating unit derived from other unsaturated monomer (a1-3).

In an embodiment of the invention, the siloxane (meth) acrylate based monomer (a1-2) contains a structure of the following formula (A-1).

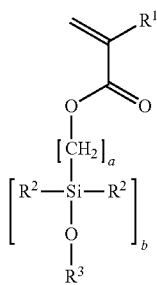

formula (A-1)

In formula (A-1), $R^1$ represents a hydrogen atom or a methyl group; a represents an integer of 1 to 6; $R^2$ each independently represents a $C_1$ to $C_{12}$ alkyl group, a phenyl group, a $C_1$ to $C_6$ alkoxy group, or a group represented by the following formula (A-2); b represents an integer of 1 to 150; $R^3$ represents a $C_1$ to $C_6$ alkyl group or a group represented by the following formula (A-3); when there are plural repeating units derived from the formula (A-1) in the main chain, each repeating unit derived from the formula (A-1) can be the same or different.

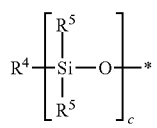

formula (A-2)

In formula (A-2), $R^4$ and $R^5$ each independently represents a $C_1$ to $C_{12}$ alkyl group or a phenyl group; c represents an integer of 2 to 13.

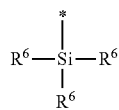

formula (A-3)

In formula (A-3), $R^6$ each independently represents a $C_1$ to $C_{12}$ alkyl group or a phenyl group.

In an embodiment of the invention, the siloxane based monomer (a2) further includes a monomer (a2-2) represented by the following formula (A-8).

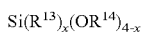

$Si(R^{13})_x(OR^{14})_{4-x}$  formula (A-8)

In formula (A-8), $R^{13}$ represents a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group; $R^{14}$ represents a hydrogen atom, a $C_1$ to $C_6$ hydrocarbon group, a $C_1$ to $C_6$ acyl group, or a $C_6$ to $C_{15}$ aryl group; when there are 2 or more $R^{13}$ or $R^{14}$ in the formula (A-8), each $R^{13}$ or $R^{14}$ can be the same or different; and x represents an integer of 0 to 3.

In an embodiment of the invention, based on 100 parts by weight of the complex resin (A), a usage amount of the o-naphthoquinone diazide sulfonate (B) is 1 part by weight to 30 parts by weight; and a usage amount of the solvent (C) is 100 parts by weight to 1600 parts by weight.

In an embodiment of the invention, the photosensitive resin composition further includes a thermal generator (D).

In an embodiment of the invention, based on 100 parts by weight of the complex resin (A), a usage amount of the thermal generator (D) is 0.5 parts by weight to 6 parts by weight.

The invention further provides a protective film. The protective film is formed by the above photosensitive resin composition.

The invention further provides a liquid crystal display element. The liquid crystal display element includes the above protective film.

Based on the above, since the photosensitive resin composition of the invention includes the complex resin (A) having the main chain of poly (meth)acrylic acid structure and the side chain of polysiloxane structure, the photosensitive resin composition has both characteristics of high transparency and excellent chemical resistance. Therefore, the problem of poor transparency and chemical resistance of the protective film can be improved, such that the protective film is suitable for a liquid crystal display element.

In order to make the aforementioned features and advantages of the disclosure more comprehensible, embodiments are described in detail below.

DESCRIPTION OF THE EMBODIMENTS

It should be mentioned that, in the following, (meth) acrylic acid represents acrylic acid and/or methacrylic acid, and (meth)acrylate represents acrylate and/or methacrylate. Similarly, (meth)acryloyl group represents acryloyl group and/or methacryloyl group.

In addition, in the following, "~based" is a general representative of compounds or repeating units with similar functional groups <Photosensitive Resin Composition>

The invention provides a photosensitive resin composition including a complex resin (A), an o-naphthoquinone diazide sulfonate (B), and a solvent (C). Moreover, the photosensitive resin composition can further include a thermal generator (D) and an additive (E) if needed. In the following, each component of the photosensitive resin composition of the invention is described in detail.

Complex Resin (A)

The complex resin (A) includes a main chain and a side chain. The main chain includes a repeating unit derived from siloxane (meth)acrylate based monomer (a1-2); and the side chain includes a repeating unit derived from siloxane based monomer (a2), and is bonded to the repeating unit derived from siloxane (meth)acrylate based monomer (a1-2).

Specifically, the complex resin (A) satisfies at least one of the following conditions (I) and (II):

Condition (I): the main chain further includes a repeating unit derived from unsaturated monomer (a1-1) including a carboxylic acid or a carboxylic anhydride, the unsaturated monomer (a1-1) including a carboxylic acid or a carboxylic anhydride includes a carboxylic acid group structure and an unsaturated bond, or a carboxylic anhydride group structure and an unsaturated bond.

Condition (II): the siloxane based monomer (a2) includes a monomer (a2-1) represented by the following formula (A-4).

In addition, in an embodiment of the invention, the main chain can further includes a repeating unit derived from other unsaturated monomer (a1-3). In the following, each component of the complex resin (A) of the invention is described respectively.

Unsaturated Monomer (a1-1) Including a Carboxylic Acid or a Carboxylic Anhydride The unsaturated monomer (a1-1) including a carboxylic acid or a carboxylic anhydride includes a functional group including a carboxylic acid group structure and an unsaturated bond, or a functional group including a carboxylic anhydride group structure and an unsaturated bond. For example, the unsaturated monomer (a1-1) including a carboxylic acid or a carboxylic anhydride can include but is not limited to an unsaturated monocarboxylic acid compound, an unsaturated dicarboxylic acid compound, an unsaturated acid anhydride compound, an unsaturated polycyclic carboxylic acid compound, an unsaturated polycyclic dicarboxylic acid compound and an unsaturated polycyclic acid anhydride compound.

Examples of the unsaturated monocarboxylic acid compound are as below: (meth)acrylic acid, butenoic acid, α-chloroacrylic acid, ethyl acrylate, cinnamic acid, 2-(meth)acryloyloxyethyl succinate, 2-(meth)acryloyloxyethyl hexahydrophthalate, 2-(meth)acryloyloxyethyl phthalate and omega-carboxyl polycaprolactone polyol monoacrylate (trade name of ARONIX M-5300, manufactured by Toagosei Co., Ltd.).

Examples of the unsaturated dicarboxylic acid compound are as below: maleic acid, fumaric acid, mesaconic acid, itaconic acid and citraconic acid. In an example of the invention, the unsaturated dicarboxylic acid anhydride compound is the anhydride compound of the aforementioned unsaturated dicarboxylic acid compound.

Examples of the unsaturated polycyclic carboxylic acid compound are as below: 5-carboxyl bicyclo [2.2.1] hept-2-ene, 5-carboxyl-5-methylbicyclo [2.2.1] hept-2-ene, 5-carboxyl-5-ethylbicyclo [2.2.1] hept-2-ene, 5-carboxyl-6-methylbicyclo [2.2.1] hept-2-ene and 5-carboxyl-6-ethylbicyclo [2.2.1]hept-2-ene.

Examples of the unsaturated polycyclic dicarboxylic acid compound are as below: 5,6-dicarboxylic bicyclo [2.2.1] hept-2-ene.

The unsaturated polycyclic dicarboxylic acid anhydride compound is, for example, the anhydride compound of the aforementioned unsaturated polycyclic dicarboxylic acid compound.

The preferred examples of the unsaturated monomer (a1-1) including a carboxylic acid or a carboxylic anhydride are acrylic acid, methacrylic acid, maleic anhydride, 2-methacryloyloxyethyl succinate and 2-methacryloyloxyethyl hexahydrophthalic acid.

The unsaturated monomer (a1-1) including a carboxylic acid or a carboxylic anhydride can be used alone or in multiple combinations.

Siloxane (Meth)Acrylate Based Monomer (a1-2)

The siloxane (meth)acrylate based monomer (a1-2) contains, for example, a structure of the following formula (A-1).

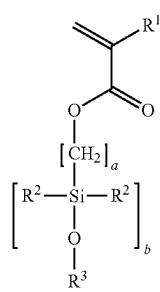

formula (A-1)

In formula (A-1), $R^1$ represents a hydrogen atom or a methyl group; a represents an integer of 1 to 6; $R^2$ each independently represents a $C_1$ to $C_{32}$ alkyl group, a phenyl group, a $C_1$ to $C_6$ alkoxy group, or a group represented by the following formula (A-2). b represents an integer of 1 to 150; $R^3$ represents a $C_1$ to $C_6$ alkyl group or a group represented by the following formula (A-3). When there are plural repeating units derived from the formula (A-1) in the main chain, each repeating unit derived from the formula (A-1) can be the same or different.

formula (A-2)

In formula (A-2), $R^4$ and $R^5$ each independently represents a $C_1$ to $C_{12}$ alkyl group or a phenyl group; c represents an integer of 2 to 13;

formula (A-3)

In formula (A-3), $R^6$ each independently represents a $C_1$ to $C_{12}$ alkyl group or a phenyl group.

Specific examples of the $C_1$ to $C_{12}$ alkyl group include, for example, methyl group, ethyl group, propyl group, butyl group, amyl group, hexylgroup, heptyl group, octylgroup, nonyl group, or decyl group.

Specific examples of the $C_1$ to $C_6$ alkoxy group include, for example, methoxy group, ethoxy group, propoxy group, or butoxy group.

The siloxane (meth)acrylate based monomer (a1-2) represented by the formula (A-1) includes allylsilane-based and methacrylic silane-based. Examples are 3-methacryloxypropyltrimethoxysilane, 3-methacryloxypropyltriethoxysilane, 3-methacryloxypropylmethyldimethoxysilane, 3-methacryloxypropylmethyldiethoxysilane, compounds represented by the following formulas (1-1) to (1-6), or FM-0711, FM-0721, FM-0725 (manufactured by Chisso Corporation).

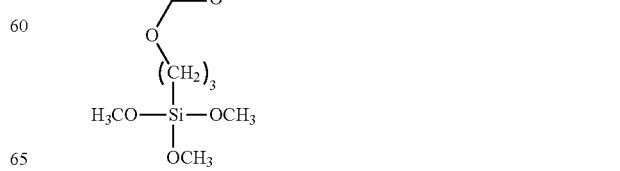

formula (1-1)

formula (1-2)

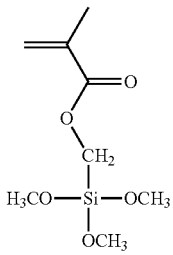

formula (1-3)

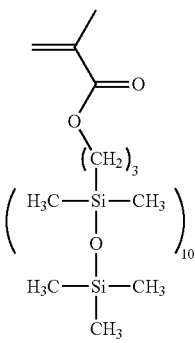

formula (1-4)

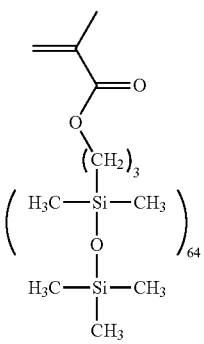

formula (1-5)

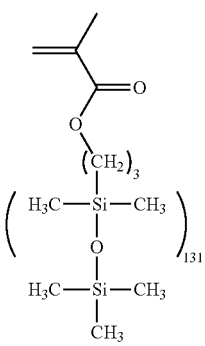

formula (1-6)

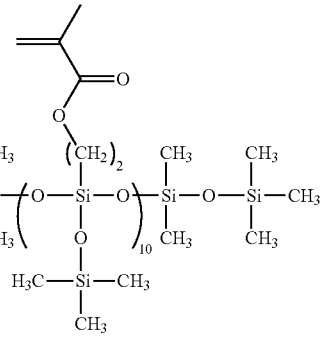

The siloxane (meth)acrylate based monomer (a1-2) represented by the formula (A-1) can be used alone or in multiple combinations.

Other Unsaturated Monomer (a1-3)

The other unsaturated monomer (a1-3) may include but not limited to a (meth)acrylate compound containing an epoxy group, an a-alkyl acrylate compound containing an epoxy group, an epoxypropyl ether compound, an alkyl (meth)acrylate, an alicyclic (meth)acrylate, an aryl (meth)acrylate, an unsaturated dicarboxylic diester, a hydroxyalkyl (meth)acrylate, a polyether of (meth)acrylate, an aromatic vinyl compound and other unsaturated compounds except the aforementioned unsaturated compounds.

Specific examples of the (meth)acrylate compound containing an epoxy group are as below: glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate and 3,4-epoxycyclohexylmethyl (meth)acrylate.

Specific examples of the α-alkyl acrylate compound containing an epoxy group are as below: glycidyl α-ethacrylate, glycidyl, α-n-propylacrylate, glycidyl α-n-butylacrylate and 6,7-epoxyheptyl α-ethacrylate.

Specific examples of the epoxypropyl ether compound are as below: o-vinylbenzylglycidylether, m-vinylbenzylglycidylether and p-vinylbenzylglycidylether.

Specific examples of the alkyl (meth)acrylate are as below: methyl (meth)acrylate, ethyl (meth)acrylate, n-propyl (meth)acrylate, isopropyl (meth)acrylate, n-butyl (meth)acrylate, iso-butyl (meth)acrylate, sec-butyl (meth)acrylate and tert-butyl (meth)acrylate.

Specific examples of the alicyclic (meth)acrylate are as below: cyclohexyl (meth)acrylate, 2-methylcyclohexyl (meth)acrylate, tricyclic[$5.2.1.0^{2,6}$]deca-8-yl (meth)acrylate (or referred to as dicyclopentanyl (meth)acrylate), dicyclopentyloxyethyl (meth)acrylate, isobornyl (meth)acrylate and tetrahydrofuranyl (meth)acrylate.

Specific examples of the aryl (meth)acrylate are as below: phenyl (meth)acrylate and benzyl (meth)acrylate. Specific examples of the unsaturated dicarboxylic diester are as below: diethyl maleate, diethyl fumarate and diethyl itaconate.

Specific examples of the hydroxyalkyl (meth)acrylate are as below: 2-hydroxyethyl (meth)acrylate and 2-hydroxypropyl (meth)acrylate.

Specific examples of the polyether of (meth)acrylate are as below: polyglycol mono(meth)acrylate and polypropylene glycol mono(meth)acrylate.

Specific examples of the aromatic vinyl compound are as below: styrene, α-methylstyrene, m-methylstyrene, p-methylstyrene and p-methoxy styrene.

Specific examples of the other unsaturated compounds except the aforementioned unsaturated compounds are as below: acrylonitrile, methacrylonitrile, chloroethylene, vinylidene chloride, acrylamide, methacrylamide, vinyl acetate, 1,3-butadiene, isoprene, 2,3-dimethyl 1,3-butadiene, N-cyclohexyl maleimide, N-phenyl maleimide, N-benzyl maleimide, N-succinimide-3-maleimidobenzoate, N-succimide-4-maleimidobutyrate, N-succinimide-6-maleimidocaproate, N-succinimide-3-maleimido propionate and N-(9-acridinyl) maleimide.

The preferred examples of the other unsaturated monomer (a1-3) are as below: glycidyl methacrylate, 3,4-epoxycyclohexylmethyl (meth)acrylate, 6,7-epoxyheptyl acrylate, o-vinylbenzylglycidylether, m-vinylbenzylglycidylether p-vinylbenzylglycidylether, methyl (meth)acrylate, iso-butyl (meth)acrylate, 2-hydroxyethyl (meth)acrylate, tert-butyl (meth)acrylate, benzyl (meth)acrylate, dicyclopentanyl (meth)acrylate, dicyclopentyloxyethyl (meth)acrylate, styrene, p-methoxy styrene and isobornyl (meth)acrylate.

The other unsaturated monomer (a1-3) can be used alone or in multiple combinations.

Siloxane Based Monomer (a2)

The siloxane based monomer (a2) includes a monomer (a2-1) represented by the following formula (A-4).

In formula (A-4), $R^7$ represents a structure represented by the following formula (A-5), formula (A-6) or formula (A-7), or a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group, wherein at least one $R^7$ represents a structure represented by the following formula (A-5), formula (A-6) or formula (A-7). $R^8$ represents a hydrogen atom, a $C_1$ to $C_6$ hydrocarbon group, a $C_1$ to $C_6$ acyl group, or a $C_6$ to $C_{15}$ aryl group. When there are 2 or more $R^7$ or $R^8$ in the formula (A-4), each $R^7$ or $R^8$ can be the same or different. w represents an integer of 1 to 3.

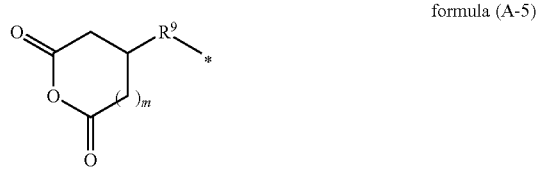

In formula (A-5), $R^9$ represents a $C_1$ to $C_{10}$ hydrocarbon group; m is 0 or 1; * represents a bonding site.

In formula (A-6), $R^{10}$ represents a single bond, a $C_1$ to $C_{10}$ alkyl group or a $C_1$ to $C_{10}$ alkoxy group; $R^{11}$ represents a hydrogen atom or a $C_1$ to $C_{10}$ hydrocarbon group; n is 0 or 1; * represents a bonding site.

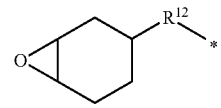

In formula (A-7), $R^{12}$ represents a single bond or a $C_1$ to $C_6$ alkylene group; * represents a bonding site.

In addition, the siloxane based monomer (a2) further includes a monomer (a2-2) represented by the following formula (A-8).

In formula (A-8), $R^{13}$ represents a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group. $R^{14}$ represents a hydrogen atom, a $C_1$ to $C_6$ hydrocarbon group, a $C_1$ to $C_6$ acyl group, or a $C_6$ to $C_{15}$ aryl group When there are 2 or more $R^{13}$ or $R^{14}$ in the formula (A-8), each $R^{13}$ or $R^{14}$ can be the same or different; and x represents an integer of 0 to 3.

More specifically, when $R^7$ or $R^{13}$ represents a $C_1$ to $C_{10}$ alkyl group, specifically, $R^7$ or $R^{13}$ is, for instance, a methyl group, an ethyl group, an n-propyl group, an isopropyl group, an n-butyl group, a tert-butyl group, an n-hexyl group, or an n-decyl group. Moreover, $R^7$ or $R^{13}$ can also be an alkyl group having other substituents. Specifically, $R^7$ or $R^{13}$ is, for instance, trifluoromethyl, 3,3,3-trifluoropropyl, 3-aminopropyl, 3-mercaptopropyl, or 3-isocyanatepropyl.

When $R^7$ or $R^{13}$ represents a $C_2$ to $C_{10}$ alkenyl group, specifically, $R^7$ or $R^{13}$ is, for instance, a vinyl group. Moreover, $R^7$ or $R^{13}$ can also be an alkenyl group having other substituents. Specifically, $R^7$ or $R^{13}$ is, for instance, 3-acryoyloxypropyl or 3-methylacryloyloxypropyl.

When $R^7$ or $R^{13}$ represents a $C_2$ to $C_{10}$ alkynyl group, specifically, $R^7$ or $R^{13}$ is, for instance, an ethynyl group. Moreover, $R^7$ or $R^{13}$ can also be an alkynyl group having other substituents.

When $R^7$ or $R^{13}$ represents an unsubstituted phenyl group or a phenyl group of which a part of hydrogen atoms is substituted by a halogen or a $C_1$ to $C_{10}$ hydrocarbon group, specifically, $R^7$ or $R^{13}$ is, for instance, a phenyl group, a tolyl group, or a naphthyl group. Moreover, $R^7$ or $R^{13}$ can also be an aryl group having other substituents. Specifically, $R^7$ or $R^{13}$ is, for instance, o-hydroxyphenyl, 1-(o-hydroxyphenyl) ethyl, 2-(o-hydroxyphenyl)ethyl, or 4-hydroxy-5-(p-hydroxyphenylcarbonyloxy)pentyl.

When $R^7$ represents a structure represented by formula (A-5), $R^9$ is preferably a $C_1$ to $C_{10}$ alkyl group. Specific examples of the structure represented by formula (A-5) are groups represented by formulas (A-5-1) to (A-5-3). It is noted that the structure represented by formula (A-5) is a group formed by intramolecular dehydration of dicarboxylic acid(s), and specific examples of the dicarboxylic acid may be succinic acid or glutaric acid.

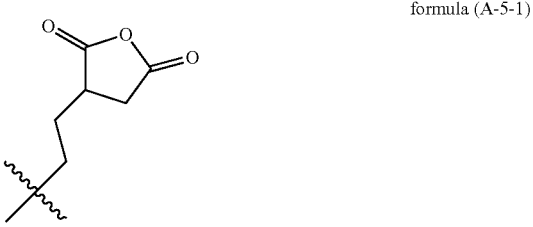

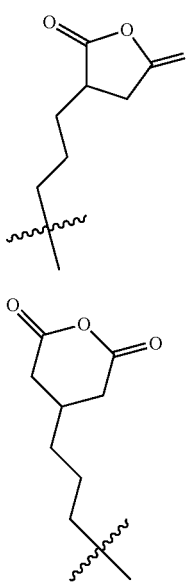

formula (A-5-2)

formula (A-5-3)

When $R^7$ represents a structure represented by formula (A-6), $R^{10}$ is preferably a $C_1$ to $C_{10}$ alkyl group or a $C_1$ to $C_{10}$ alkoxy group, and $R^{11}$ is preferably a hydrogen atom. Specific examples of the structure represented by formula (A-6) are oxetanylpentyl group, glycidoxypropyl group or 2-oxetanyl butoxyl group. It is noted that the structure represented by formula (A-6) is a group formed by intramolecular dehydration of diol(s), and specific examples of the diol may be propylene glycol, butanediol, pentanediol.

When $R^7$ represents a structure represented by formula (A-7), $R^{12}$ is preferably a $C_1$ to $C_6$ alkylene group. A specific example of the structure represented by formula (A-7) is 2-(3,4-epoxycyclohexyl)ethyl group.

On the other hand, when $R^8$ or $R^{14}$ represents a $C_1$ to $C_6$ alkyl group, $R^8$ or $R^{14}$ is, for example, methyl group, ethyl group, n-propyl group, isopropyl group or n-butyl group. When $R^8$ or $R^{14}$ represents a $C_1$ to $C_6$ acyl group, $R^8$ or $R^{14}$ is, for example, acetyl group. When $R^8$ or $R^{14}$ represents a $C_6$ to $C_{15}$ aryl group, $R^8$ or $R^{14}$ is, for example, phenyl.

w represents an integer of 1 to 3, and x represents an integer of 0 to 3. When w or x represents 2 or 3, a plurality of $R^7$ or $R^{13}$ may be the same or different; and when w or x represents 1 or 2, a plurality of $R^8$ or $R^{14}$ may be the same or different.

In formula (A-4), specific examples of the monomer (a2-1) are, for example, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 2-oxetanylbutoxypropyltriphenoxy silane, the commercially available products from Toagosei Company: 2-oxetanylbutoxypropyltrimethoxysilane (trade name: TMSOX-D), 2-oxetanylbutoxypropyltriethoxysilane (trade name: TESOX-D), 3-triphenoxysilyl propyl succinic anhydride, the commercially available products from Shin-Etsu Chemical Co., Ltd.: 3-trimethoxysilyl propyl succinic anhydride (trade name: X-12-967), the commercially available products from WACKER Company: 3-(triethoxysilyl) propyl succinic anhydride (trade name: GF-20), 3-(trimethoxysilyl) propyl glutaric anhydride (TMSG), 3-(triethoxysilyl) propyl glutaric anhydride, 3-(triphenoxysilyl) propyl glutaric anhydride, diisopropoxy-di(2-oxetanylbutoxypropyl) silane (DIDOS), di(3-oxetanylpentyl)dimethoxy silane, di(n-butoxysilyl) di(propyl succinic anhydride), (dimethoxysilyl) di(ethyl succinic anhydride), 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)methoxy silane, phenoxysilyltripropyl succinic anhydride, or methoxysilyl diethyl succinic anhydride.

In formula (A-8), specific examples of the monomer (a2-2) are, for example, tetramethoxysilane, tetraethoxysilane, tetraacetoxysilane, tetraphenoxy silane, methyltrimethoxy silane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryoyloxypropyltrimethoxysilane, 3-methylacryloyloxypropyltrimethoxysilane (MPTMS), 3-methylacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-mercaptopropyltrimethoxysilane, dimethyldimethoxysilane (DMDMS), dimethyldiethoxysilane, dimethyldiacetyloxysilane, di-n-butyldimethoxysilane, diphenyldimethoxysilane, trimethylmethoxysilane, or tri-n-butylethoxysilane.

The monomer (a2-2) can be used alone or in multiple combinations.

Method of Preparing Complex Resin (A)

A method of preparing the complex resin (A) can be, but is not limited to, any one of the following methods (1) to (3).

Method (1)

First, the unsaturated monomer (a1-1) including a carboxylic acid or a carboxylic anhydride, the siloxane (meth) acrylate based monomer (a1-2) and the other unsaturated monomer (a1-3) are subjected to a copolymerization reaction, preferably a radical polymerization reaction, to obtain a main chain copolymer containing a siloxane group. A side chain polycondensate is obtained by a hydrolytic polycondensation reaction after adding the siloxane based monomer (a2) into the main chain copolymer containing a siloxane group, and the complex resin (A) is then obtained.

Method (2)

First, the unsaturated monomer (a1-1) including a carboxylic acid or a carboxylic anhydride, the siloxane (meth) acrylate based monomer (a1-2) and the other unsaturated monomer (a1-3) are subjected to a copolymerization reaction, preferably a radical polymerization reaction, to obtain a main chain copolymer containing a siloxane group in advance. On the other hand, a side chain polycondensate is first obtained by a hydrolytic polycondensation reaction to the siloxane based monomer (a2). Eventually, the main chain copolymer containing a siloxane group and the side chain polycondensate are subjected to a hydrolytic polycondensation reaction, and the complex resin (A) is then obtained.

Method (3)

The main chain copolymer containing a siloxane group and the side chain polycondensate are first obtained by the same steps as described in the method (2), and the difference thereof is: in method (3), a portion of the siloxane based monomer (a2) is also added when preparing the main chain copolymer containing a siloxane group, to generate the polycondensate of the side chain on the siloxane group on the main chain copolymer. That is, a portion of the side chain is generated simultaneously with the main chain generation. A final hydrolytic polycondensation reaction is then conducted to obtain the complex resin (A).

The copolymerization reaction of the main chain copolymer of the invention is not particularly limited, preferably a radical polymerization reaction. The main chain copolymer of the invention is obtained by copolymerization among the unsaturated monomer (a1-1) including a carboxylic acid or a carboxylic anhydride, the siloxane (meth)acrylate based monomer (a1-2) and the other unsaturated monomer (a1-3) in a solvent under the presence of a suitable polymerization initiator.

During the copolymerization, based on a total usage amount of 100 parts by weight of the monomers for polymerization (a1-1), (a1-2) and (a1-3), the usage amount of the unsaturated monomer (a1-1) including a carboxylic acid or a carboxylic anhydride is 0 part by weight to 40 parts by weight, preferably 5 parts by weight to 35 parts by weight, and more preferably 10 parts by weight to 30 parts by weight; the usage amount of the siloxane (meth)acrylate based monomer (a1-2) is 5 parts by weight to 50 parts by weight, preferably 10 parts by weight to 45 parts by weight, and more preferably 15 parts by weight to 40 parts by weight; and the usage amount of the other unsaturated monomer (a1-3) is 10 parts by weight to 95 parts by weight, preferably 20 parts by weight to 85 parts by weight, and more preferably 30 parts by weight to 75 parts by weight.

Examples of the polymerization initiator used for manufacturing the main chain copolymer of the invention are an azo compound or a peroxide. Examples of the azo compound are as below: 2,2'-azobis(isobutyronitrile), 2,2'-azobis (2,4-dimethylvaleronitrile), 2,2'-azobis(4-methoxyl-2,4-dimethylvaleronitrile), 2,2'-azobis(2-methyl butyronitrile), 4,4'-azobis(4-cyano valeric acid) and 2,2'-azobis(dimethyl-2-methylpropionate). Examples of the peroxide are as below: dibenzoyl peroxide, dilauroyl peroxide, tert-butyl peroxypivalate, 1,1-di(tert-butylperoxy)cyclohexane and hydrogen peroxide. The polymerization initiator can be used alone or in multiple combinations.

The solvent used for manufacturing the main chain copolymer of the invention can include but not limited to alcohol, ether, glycol ether, glycol alkyl ether acetate, diethylene glycol, dipropylene glycol, propylene glycol monoalkyl ether, propylene glycol alkyl ether acetate, propylene glycol alkyl ether propionate, aromatic hydrocarbon, ketone and ester.

Examples of the alcohol are as below: methanol, ethanol, phenylcarbinol, 2-phenylethanol and 3-phenyl-1-propanol. Example of the ether is tetrahydrofuran. Examples of the glycol ether are as below: ethylene glycol monopropyl ether, ethylene glycol monomethyl ether and ethylene glycol monoethyl ether. Examples of the glycol alkyl ether acetate are as below: glycol butyl ether acetate, glycol ethyl ether acetate and glycol methyl ether acetate. Examples of the diethylene glycol are as below: diethylene glycol monomethyl ether, diethylene glycol monoethyl ether, diethylene glycol monobutyl ether, diethylene glycol dimethyl ether, diethylene glycol diethyl ether, diethylene glycol methyl ethyl ether. Examples of the dipropylene glycol are as below: dipropylene glycol monomethyl ether, dipropylene glycol monoethyl ether, dipropylene glycol dimethyl ether, dipropylene glycol diethyl ether and dipropylene glycol methyl ethyl ether. Examples of the propylene glycol monoalkyl ether are as below: propylene glycol monomethyl ether, propylene glycol monoethyl ether, propylene glycol monopropyl ether and propylene glycol monobutyl ether. Examples of the propylene glycol alkyl ether acetate are as below: propylene glycol methyl ether acetate, propylene glycol ethyl ether acetate, propylene glycol propyl ether acetate and propylene glycol butyl ether acetate. Examples of the propylene glycol alkyl ether propionate are as below: propylene glycol methyl ether propionate, propylene glycol ethyl ether propionate, propylene glycol propyl ether propionate and propylene glycol butyl ether propionate. Examples of the aromatic hydrocarbon are as below: toluene and xylene. Examples of the ketone are as below: methyl ethyl ketone, cyclohexanone and diacetone alcohol. Examples of the ester are as below: methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl glycolate, ethyl glycolate, butyl glycolate, methyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutyrate, methyl methoxylacetate, ethyl methoxylacetate, butyl methoxylacetate, methyl ethoxylacetate, ethyl ethoxylacetate, propyl ethoxylacetate, butyl ethoxylacetate, methyl propoxylacetate, ethyl propoxylacetate, propyl propoxylacetate, butyl propoxylacetate, methyl butoxyacetate, ethyl butoxyacetate, propyl butoxyacetate, butyl butoxyacetate, 3-methoxylbutyl acetate, methyl 2-methoxylpropionate, ethyl 2-methoxylpropionate, propyl 2-methoxylpropionate, butyl 2-methoxylpropionate, methyl 2-ethoxylpropionate, ethyl 2-ethoxylpropionate, propyl 2-ethoxylpropionate, butyl 2-ethoxylpropionate, methyl 2-butoxypropionate, ethyl 2-butoxypropionate, propyl 2-butoxypropionate, butyl 2-butoxypropionate, methyl 3-methoxylpropionate, ethyl 3-methoxylpropionate, propyl 3-methoxylpropionate, butyl 3-methoxylpropionate, methyl 3-ethoxylpropionate, ethyl 3-ethoxylpropionate, propyl 3-ethoxylpropionate, butyl 3-ethoxylpropionate, methyl 3-propoxylpropionate, ethyl 3-propoxylpropionate, propyl 3-propoxylpropionate, butyl 3-propoxylpropionate, methyl 3-butoxypropionate, ethyl 3-butoxypropionate, propyl 3-butoxypropionate and butyl 3-butoxypropionate.

The polycondensation reaction of the invention is not particularly limited. Consider the method (1) as an example, preferably, solvents, water and optionally catalyst are added into a mixture of the siloxane based monomer (a2) and the main chain copolymer containing a siloxane group. The mixture is then stirred and heated at 50° C. to 100° C. for 0.5 hours to 120 hours. Byproducts such as alcohol-based and water can further be removed by distillation while stirring.

During the polycondensation reaction, based on a total usage amount of 100 parts by weight of the siloxane based monomer (a2), the usage amount of the monomer (a2-1) represented by formula (A-4) is 5 part by weight to 40 parts by weight, preferably 7 parts by weight to 35 parts by weight, and more preferably 10 parts by weight to 30 parts by weight; and the usage amount of the monomer (a2-2) represented by formula (A-8) is 60 parts by weight to 95 parts by weight, preferably 65 parts by weight to 93 parts by weight, and more preferably 70 parts by weight to 90 parts by weight.

The solvent is not particularly limited, and can be the same or different from the solvent (C) included in the photosensitive resin composition of the invention.

The catalyst is not particularly limited, and is preferably selected from an acidic catalyst or a basic catalyst. The acidic catalyst can include, but is not limited to, hydrochloric acid, nitric acid, sulfuric acid, fluoric acid, oxalic acid, phosphoric acid, acetic acid, trifluoroacetic acid, formic acid, a polybasic carboxylic acid or an anhydride thereof, or ion exchange resins and the like. The basic catalyst can include, but is not limited to, diethylamine, triethylamine, tripropylamine, tributylamine, tripentylamine, trihexylamine, triheptylamine, trioctylamine, diethanolamine, triethanolamine, sodium hydroxide, and potassium hydroxide, an amine group-containing alkoxyl silane, or ion exchange resins and the like.

Concerning stability, the complex resin (A) obtained by condensation reaction preferably excludes the byproducts (such as alcohol-based or water) and the catalyst. Accordingly, the obtained complex resin (A) may be optionally purified. The purification method is not particularly limited. Preferably, a hydrophobic solvent is used for the dilution of the complex resin (A). Subsequently, the organic layer is then washed with water several times and concentrated by an evaporator to remove the alcohol-based or water. In addition, ion exchange resins may be used to remove the catalyst.

The weight average molecular weight of the complex resin (A) is 3,000 to 30,000, preferably 4,000 to 25,000, and more preferably 5,000 to 20,000.

In the case that the photosensitive resin composition does not contain the complex resin (A) having specific structures as the main chain and the side chain, the photosensitive resin composition has the issue of poor transparency and chemical resistance.

o-Naphthoquinone Diazide Sulfonate (B)

The o-naphthoquinone diazide sulfonate (B) is not particularly limited, and common o-naphthoquinone diazide sulfonate may be used. The o-naphthoquinone diazide sulfonate (B) may be completely esterified or partially esterified ester-based compound(s).

The o-naphthoquinone diazide sulfonate (B) is preferably prepared by reacting an o-naphthoquinone diazide sulfonic acid or salts thereof with a hydroxy compound. The o-naphthoquinone diazide sulfonate (B) is more preferably prepared by reacting the o-naphthoquinone diazide sulfonic acid or salts thereof with a polyhydroxy compound.

The o-naphthoquinone diazide sulfonic acid may be, for example, o-naphthoquinone diazide-4-sulfonic acid, o-naphthoquinone diazide-5-sulfonic acid or o-naphthoquinone diazide-6-sulfonic acid. In addition, the o-naphthoquinone diazide sulfonic acid salts may be, for example, o-naphthoquinone diazonaphthoquinone sulfonyl halides.

The polyhydroxy compound may be, for example, a hydroxybenzophenone-based compound, a hydroxyaryl-based compound, a (hydroxyphenyl) hydrocarbon-based compound, or other aromatic hydroxyl-based compounds.

The hydroxybenzophenone-based compound may be, for example, 2,3,4-trihydroxy-benzophenone, 2,4,4'-trihydroxy-benzophenone, 2,4,6-trihydroxy-benzophenone, 2,3,4,4'-tetrahydroxy-benzophenone, 2,4,2',4'-tetrahydroxy-benzophenone, 2,4,6,3',4'-pentahydroxy-benzophenone, 2,3,4,2',4'-pentahydroxy-benzophenone, 2,3,4,2',5'-pentahydroxy-benzophenone, 2,4,5,3',5'-pentahydroxy-benzophenone or 2,3,4,3',4',5'-hexahydroxy-benzophenone.

The hydroxyaryl-based compound may be, for example, a hydroxy aryl-based compound represented by formula (B-1):

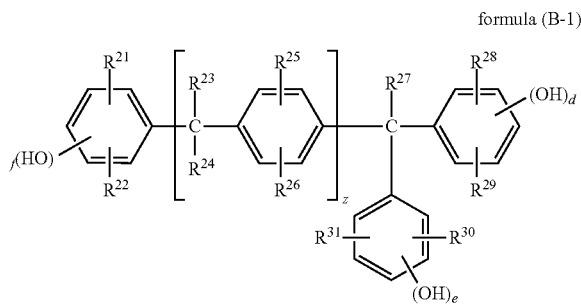

formula (B-1)

In formula (B-1), $R^{21}$ and $R^{22}$ each independently represents a hydrogen atom, a halogen atom or a $C_1$ to $C_6$ alkyl group; $R^{23}$, $R^{24}$ and $R^{27}$ each independently represents a hydrogen atom or a $C_1$ to $C_6$ alkyl group; $R^{25}$, $R^{26}$, $R^{28}$, $R^{29}$, $R^{30}$ and $R^{31}$ each independently represents a hydrogen atom, a halogen atom, a $C_1$ to $C_6$ alkyl group, a $C_1$ to $C_6$ alkoxy group, a $C_1$ to $C_6$ alkenyl group or cycloalkyl group; d, e and f each independently represents an integer of 1 to 3; and z represents 0 or 1.

Specific examples of the hydroxyaryl-based compound represented by formula (B-1) may be: tris(4-hydroxyphenyl) methane, bis(4-hydroxy-3,5-dimethyl-phenyl)-4-hydroxyphenyl methane, bis(4-hydroxy-3,5-dimethyl-phenyl)-3-hydroxyphenyl methane, bis(4-hydroxy-3,5-dimethyl-phenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane bis(4-hydroxy-2,5-dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis (3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxyphenyl)isopropyl]-4-[1,1-bis(4-hydroxyphenyl) ethyl] benzene or 1-[1-(3-methyl-4-hydroxyphenyl)isopropyl]-4-[1,1-bis(3-methyl-4-hydroxyphenyl)ethyl] benzene.

The (hydroxyphenyl) hydrocarbon-based compound may be, for example, a (hydroxyphenyl) hydrocarbon-based compound represented by formula (B-2):

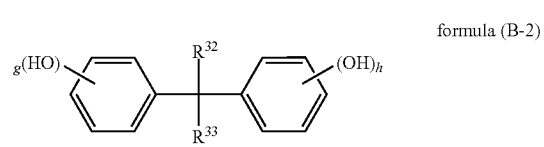

formula (B-2)

In formula (B-2), $R^{32}$ and $R^{33}$ each independently represents a hydrogen atom or a $C_1$ to $C_6$ alkyl group; g and h each independently represents an integer of 1 to 3.

Specific examples of the (hydroxyphenyl) hydrocarbon-based compound represented in formula (B-2) may be: 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, bis(2,3,4-trihydroxyphenyl) methane or bis(2,4-dihydroxyphenyl) methane and the like.

Specific examples of the other aromatic hydroxyl-based compounds may be: phenol, p-methoxyphenol, dimethylphenol, hydroquinone, bisphenol A, naphthol, catechol, 2,3-pyrogallol methyl ether, 2,3-pyrogallol-1,3-dimethyl ether, 3,4,5-trihydroxy benzoic acid, or partially esterified or etherified 3,4,5-trihydroxy benzoic acid.

The polyhydroxy compound is preferably 1-[1-(4-hydroxyphenyl) isopropyl]-4-[1,1-bis(4-hydroxyphenyl) ethyl] benzene, 2,3,4-trihydroxy-benzophenone, 2,3,4,4'-tetrahydroxy benzophenone, or a combination thereof. The hydroxy compound can be used alone or in multiple combinations.

The reaction of o-naphthoquinone diazide sulfonic acid or the salts thereof with the hydroxy compound is usually performed in an organic solvent, such as dioxane, N-pyrrolidone, acetamide and etc. Furthermore, the reaction is preferably performed in an alkaline condensing agent, such as triethanolamine, an alkali metal carbonate or an alkali metal bicarbonate.

The degree of esterification of the o-naphthoquinone diazide sulfonate (B) is preferably more than 50%. That is, based on 100 mol % of the total amount of the hydroxyl groups in the hydroxy compound, 50 mole % or more hydroxyl groups in the hydroxy compound react with the o-naphthoquinone diazide sulfonic acid or salts thereof in the esterification reaction. The degree of esterification of the o-naphthoquinone diazide sulfonate (B) is more preferably 60% or more.

Based on a usage amount of 100 parts by weight of the complex resin (A), the usage amount of the o-naphthoquinone diazide sulfonate (B) is 1 part by weight to 30 parts by weight; preferably 3 parts by weight to 25 parts by weight; and more preferably 5 parts by weight to 20 parts by weight.
Solvent (C)

The solvent (C) is not particularly limited. Specific examples of the solvent (C) may be a compound containing an alcoholic hydroxy group or a cyclic compound containing a carbonyl group.

The compound containing the alcoholic hydroxy group may be, for example, acetol, 3-hydroxy-3-methyl-2-butanone, 4-hydroxy-3-methyl-2-butanone, 5-hydroxy-2-pentanone, 4-hydroxy-4-methyl-2-pentanone (also known as diacetone alcohol, DAA), ethyl lactate, butyl lactate, propylene glycol monomethyl ether, propylene glycol monoethyl ether (PGEE), propylene glycol methyl ether acetate (PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol or a combination thereof. It is noted that the compound containing the alcoholic hydroxy group is preferably diacetone alcohol, ethyl lactate, propylene glycol monoethyl ether, propylene glycol methyl ether acetate or combinations thereof. The compound containing the alcoholic hydroxy group can be used alone or in multiple combinations.

The cyclic compound containing the carbonyl group may be, for example, γ-butyrolactone, γ-valerolactone, δ-valerolactone, propylene carbonate, N-methyl pyrrolidone, cyclohexanone or cycloheptanone. It is noted that the cyclic compound containing the carbonyl group is preferably γ-butyrolactone, N-methyl pyrrolidone, cyclohexanone or the combinations thereof. The cyclic compound containing the carbonyl group can be used alone or in multiple combinations.

The compound containing the alcoholic hydroxy group may be used in combination with the cyclic compound containing the carbonyl group, and a weight ratio therebetween is not particularly limited. The weight ratio of the compound containing the alcoholic hydroxy group and the cyclic compound containing the carbonyl group ranges preferably from 99/1 to 50/50; more preferably from 95/5 to 60/40. It is noted that when the weight ratio of the compound containing the alcoholic hydroxy group and the cyclic compound containing the carbonyl group is from 99/1 to 50/50 in the solvent (C), the unreacted silanol (Si—OH) groups in the complex resin (A) are unlikely to carry on a condensation reaction and storage stability is lowered. In addition, since the compound containing the alcoholic hydroxy group and the cyclic compound containing the carbonyl group have good compatibility with the o-naphthoquinone diazide sulfonate (B), a whitening phenomenon hardly occurs in the coating film and the transparency of the protective film can be maintained.

Without lowering the effect of the present invention, other solvents may be included. These other solvents may be, for example: (1) ester-based: ethyl acetate, n-propyl acetate, iso-propyl acetate, n-butyl acetate, isobutyl acetate, propylene glycol methyl ether acetate, 3-methoxy-1-butyl acetate or 3-methyl-3-methoxy-1-butyl acetate, etc.; (2) ketone-based: methyl isobutyl ketone, diisopropyl ketone, or diisobutyl ketone, etc.; or (3) ether-based: diethyl ether, diisopropyl ether, di-n-butyl ether or diphenyl ether.

Based on a usage amount of 100 parts by weight of the complex resin (A), the usage amount of the solvent (C) is 100 parts by weight to 1,600 parts by weight; preferably 150 parts by weight to 1,300 parts by weight; and more preferably 200 parts by weight to 1000 parts by weight.
Thermal Generator (D)

The photosensitive resin composition of the invention can further include a thermal generator (D). The thermal generator (D) is, for example, a thermal acid generator or a thermal base generator, and the thermal acid generator or the thermal base generator can be used alone or in multiple combinations.
Thermal Acid Generator The thermal acid generator includes an ionic thermal acid generator or a nonionic thermal acid generator.

The ionic thermal acid generator preferably does not contain heavy metal or halogen ion.

Specific examples of the ionic thermal acid generator include a sulfonium salt, such as: a methanesulfonic acid salt such as triphenylsulfonium, 1-dimethylthionaphthalene, 1-dimethylthio-4-hydroxynaphthalene, 1-dimethylthio-4,7-dihydroxynaphthalene, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium;

trifluoromethanesulfonate, camphorsulfonate, p-toluenesulfonate, hexafluorophosphonate, a commercially available benzyl sulfonium salt such as SI-60, SI-80, SI-100, SI-110, SI-145, SI-150, SI-80L, SI-100L, SI-110L, SI-145L, SI-150L, SI-160L, and SI-180L (all are manufactured by Sanshin Chemical Industry Corporation (Ltd.)).

Specific examples of the nonionic thermal acid generator include a halogen-containing compound, a diazomethane compound, a sulfone compound, a sulfonate compound, a carboxylate compound, a phosphate compound, a sulfonimide compound, or a sulfonebenzotriazole-based compound, and the like.

Specific examples of the halogen-containing compound include a halogen-substituted group-containing hydrocarbon compound, a halogen-substituted group-containing heterocyclic compound and the like. Examples of preferred halogen-containing compound include 1,1-bis(4-chlorophenyl)-2,2,2-trichloroethane, 2-phenyl-4,6-bis(trichloromethyl)-s-triazine, or 2-naphthyl-4,6-bis(trichloromethyl)-s-triazine.

Specific examples of the diazomethane compound include bis(trifluoromethylsufonyl)diazomethane, bis(cyclohexylsulfonyl)diazomethane, bis(phenylsulfonyl)diazomethane, bis(4-tolyl)diazomethane, bis(2,4-xylylsulfonyl)diazomethane, bis(4-chlorophenyl)diazomethane, methylsulfonyl-4-tolylsulfonyldiazomethane, cyclohexylsulfonyl(1,1-dimethylethylsulfonyl)diazomethane, bis(1,1-dimethylethylsulfonyl)diazomethane, or phenylsulfonyl(benzoyl)diazomethane.

Specific examples of the sulfone compound include a β-ketosulfone compound, a β-sulfonyl compound, a diaryldisulfone compound and the like. Preferred sulfone compound is 4-trisphenacyl sulfone, trimethylphenyl phenacyl sulfone, bis(phenylsulfonyl)methane, or 4-chlorophenyl-4-methylphenyl sulfone.

Specific examples of the sulfonate compound include an alkyl sulfonate, a haloalkyl sulfonate, an aryl sulfonate, or an imino sulfonate. Preferred specific examples thereof include benzoin tosylate, pyrogallol methanesulfonate, nitrobenzyl-9,10-diethoxyanthryl-2-sulfonate, sodium 2,6-dinitrophenylsulfonate and a commercially available imino sulfonate such as PAI-101, PAI-106 (manufactured by Midori Kagaku Co., Ltd.), or CGI-1311 (manufactured by Ciba Specialty Chemicals Co., Ltd.)

Specific examples of the carboxylate compound include o-nitrobenzyl carboxylate and the like.

Specific examples of the sulfonimide compound include N-(trifluoromethylsulfonyloxy)succinimide (trade name SI-105, manufactured by Midori Kagaku Co., Ltd.), N-(camphorsulfonyloxy) succinimide (trade name SI-106, manufactured by Midori Kagaku Co., Ltd.), N-(4-methylphenylsulfonyloxy)succinimide (trade name SI-101, manufactured by Midori Kagaku Co., Ltd.), N-(2-trifluoromethylphenylsulfonyloxy)succinimide, N-(4-fluorophenylsulfonyloxy)succinimide, N-(trifluoromethylsulfonyloxy)phthalimide, N-(camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide (trade name PI-105, manufactured by Midori Kagaku Co., Ltd.), N-(camphorsulfonyloxy) diphenylmaleimide, 4-methylphenylsulfonyloxy)diphenylmaleimide, N-(2-trifluoromethylphenylsulfonyloxy)diphenylmaleimide, N-(4-fluorophenylsulfonyloxy)diphenylmaleimide, N-(phenylsulfonyloxy)bicyclo[2.2.2.1]hept-5-ene-2,3-dicarboxylimide (trade name NDI-100, manufactured by Midori Kagaku Co., Ltd.), N-(4-methylphenylsulfonyloxy)bicyclo[2.2.1]hept-5-ene-2,3-dicarboxylimide (trade name NDI-101, manufactured by Midori Kagaku Co., Ltd.), N-(trifluoromethanesulfonyloxy)bicyclo[2.2.1]hept-5-ene-2,3-dicarboxylimide (trade name NDI-105, manufactured by Midori Kagaku Co., Ltd.), N-(nonafluorobutanesulfonyloxy)bicyclo[2.2.1]hept-5-ene-2,3-diimide (trade name NDI-109, manufactured by Midori Kagaku Co., Ltd.), N-(camphorsulfonyloxy)bicyclo[2.2.1]hept-5-ene-2,3-diimide (trade name NDI-106, manufactured by Midori Kagaku Co., Ltd.), N-(camphorsulfonyloxy)-7-oxabicyclo[2.2.1]hept-5-ene-2,3-dicarboxylimide, N-(trifluoromethylsulfonyloxy)-7-oxabicyclo [2.2.1]hept-5-ene-2,3-dicarboxylimide, N-(4-methylphenylsulfonyloxy)bicyclo[2.2.1]hept-5-ene-2,3-dicarboxylimide, N-(4-methylphenylsulfonyloxy)-7-oxabicyclo[2.2.1]hept-5-ene-2,3-dicarboxylimide, N-(2-trifluoromethylphenylsulfonyloxy)bicyclo[2.2.1]hept-5-ene-2,3-dicarboxylimide, N-(2-trifluoromethylphenylsulfonyloxy)-7-oxabicyclo[2.2.1]hept-5-ene-2,3-dicarboxylimide, N-(4-fluorophenylsulfonyloxy)bicyclo[2.2.1]hept-5-ene-2,3-dicarboxylimide, N-(4-fluorophenylsulfonyloxy)-7-oxabicyclo[2.2.1]hept-5-ene-2,3-dicarboxylimide, N-(trifluoromethylsulfonyloxy)bicyclo[2.2.1]heptane-5,6-oxy-2,3-dicarboxylimide, N-(camphorsulfonyloxy)bicyclo[2.2.1]heptane-5,6-oxy-2,3-dicarboxylimide, N-(4-methylphenylsulfonyloxy)bicyclo[2.2.1]heptane-5,6-oxy-2,3-dicarboxylimide, N-(2-trifluoromethylphenylsulfonyloxy)bicyclo[2.2.2.1]heptane-5,6-oxy-2,3-dicarboxyl imide, N-(4-fluorophenylsulfonyloxy)bicyclo[2.2.1]heptane-5,6-oxy-2,3-dicarboxylimide, N-(trifluoromethylsulfonyloxy) naphthyldicarboxylimide (trade name NAI-105, manufactured by Midori Kagaku Co., Ltd.), N-(camphorsulfonyloxy) naphthyldicarboxylimide (trade name NAI-106, manufactured by Midori Kagaku Co., Ltd.), N-(4-methylphenylsulfonyloxy)naphthyldicarboxylimide (trade name NAI-101, manufactured by Midori Kagaku Co., Ltd.), N-(phenylsulfonyloxy)naphthyldicarboxylimide (trade name NAI-100 manufactured by Midori Kagaku Co., Ltd.), N-(2-trifluoromethylphenylsulfonyloxy)naphthyldicarboxylimide, N-(4-fluorophenylsulfonyloxy)naphthyldicarboxylimide, N-(pentafluoroethylsulfonyloxy)naphthyldicarboxylimide, N-(heptafluoropropylsulfonyloxy) naphthyldicarboxylimide, N-(nonafluorobutylsulfonyloxy) naphthyldicarboxylimide (trade name NAI-109, manufactured by Midori Kagaku Co., Ltd.), N-(ethylsulfonyloxy)naphthyldicarboxylimide, N-(propylsulfonyloxy) naphthyldicarboxylimide, N-(butylsulfonyloxy)naphthyldicarboxylimide (trade name NAI-1004, manufactured by Midori Kagaku Co., Ltd.), N-(pentylsulfonyloxy)naphthyldicarboxylimide, N-(hexylsulfonyloxy)naphthyldicarboxylimide, N-(heptylsulfonyloxy)naphthyldicarboxylimide, N-(octylsulfonyloxy)naphthyldicarboxylimide, N-(nonylsulfonyloxy) naphthyldicarboxylimide.

Other examples of the thermal acid generator include tetrahydrothiophenium salts such as 1-(4-n-butoxynaphthalene-1-yl)tetrahydrothiophenium trifluoromethanesulfonate and 1-(4,7-dibutoxy-1-naphthalenyl)tetrahydrothiophenium trifluoromethanesulfonate.

Thermal Base Generator

The thermal base generator includes a transition metal complex-based and an acyloxime-based.

The transition metal complex-based is, for example, bromopentadecylamminecobalt perchlorate, bromopentadecylmethylaminecobalt perchlorate, bromopentadecylpropylaminecobalt perchlorate, hexaamminecobalt perchlorate, hexamethylaminecobalt perchlorate, hexabromopropylaminecobalt perchlorate, and the like.

The acyloxime-based is, for example, propionyl acetoxybutyl oxime, propionyl benzophenone oxime, propionyl acetone oxime, butyryl acetophenone oxime, butyryl benzophenone oxime, butyryl acetone oxime, adipoyl acetophenone oxime, adipoyl benzophenone oxime, adipoyl acetone oxime, acryloyl acetophenone oxime, acryloyl benzophenone oxime, acryloyl acetone oxime, and the like.

On the other hand, the thermal base generator preferably includes a compound represented by the following formula (D-1) or a salt derivative thereof, and/or a compound represented by the following formula (D-2), and/or a compound represented by the following formula (D-3).

Formula (D-1) is shown as below:

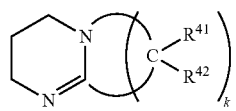

formula (D-1)

In formula (D-1), k represents an integer of 2 to 6; and $R^{41}$ and $R^{42}$ independently represent a hydrogen atom, a $C_1$ to $C_8$ alkyl group, a substituted or unsubstituted $C_1$ to $C_6$ hydroxyalkyl group, or a $C_2$ to $C_{12}$ dialkylamino group;

Preferably, k represents an integer of 3 to 5.

In one embodiment of the invention, $R^{41}$ and $R^{42}$ independently represent a hydrogen atom; a $C_1$ to $C_8$ alkyl group, for example but not limited to: methyl, ethyl, isopropyl, n-butyl, tert-butyl or n-hexyl; a substituted or unsubstituted $C_1$ to $C_6$ hydroxyalkyl group, for example but not limited to: hydroxymethyl, 2-hydroxyethyl, 2-hydroxypropyl, 2-hydroxyisopropyl, 3-hydroxy-tert-butyl or 6-hydroxyhexyl; or a $C_2$ to $C_{12}$ dialkylamino group, for example but not limited to: dimethylamino group, methylethylamino group, diethylamino group, di-isopropylamino group, tert-butyl-methylamino group or di-n-hexylamino group.

The preferred examples of the compound represented by formula (D-1) or the salt derivative thereof are 1,5-diazabicyclo[4.3.0]non-5-ene (DBN), 1,5-diazabicyclo[4.4.0]dec-5-ene, 1,8-diazabicyclo[5.4.0]undec-7-ene (DBU), 5-hydroxypropyl-1,8-diazabicyclo[5.4.0]undec-7-ene, 5-dibutylamino-1,8-diazabicyclo[5.4.0]undec-7-ene or the commercially available products manufactured by Aporo Co., Ltd.: U-CAT® SA810, U-CAT® SA831, U-CAT® SA841, U-CAT® SA851, U-CAT® 5002; more preferably, DBN, U-CAT® SA851 or U-CAT® 5002.

Formula (D-2) is shown as below:

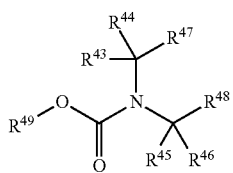

formula (D-2)

In formula (D-2), $R^{43}$, $R^{44}$, $R^{45}$ and $R^{46}$ independently represent a hydrogen atom, a substituted or unsubstituted $C_1$ to $C_8$ alkyl group, a substituted or unsubstituted $C_3$ to $C_8$ cycloalkyl group, a substituted or unsubstituted $C_1$ to $C_8$ alkoxy group, a substituted or unsubstituted $C_2$ to $C_8$ alkenyl group, a substituted or unsubstituted $C_2$ to $C_8$ alkynyl group, a substituted or unsubstituted aryl group, or a substituted or unsubstituted heterocyclic group; $R^{47}$ and $R^{48}$ independently represent a hydrogen atom, a substituted or unsubstituted $C_1$ to $C_8$ alkyl group, a substituted or unsubstituted $C_3$ to $C_8$ cycloalkyl group, a substituted or unsubstituted $C_1$ to $C_8$ alkoxy group, a substituted or unsubstituted $C_2$ to $C_8$ alkenyl group, a substituted or unsubstituted $C_2$ to $C_8$ alkynyl group, a substituted or unsubstituted aryl group, or a substituted or unsubstituted heterocyclic group, or $R^{47}$ and $R^{48}$ together form a substituted or unsubstituted monocyclic group, or $R^{47}$ and $R^{48}$ together form a substituted or unsubstituted polycyclic group; $R^{49}$ represents a substituted or unsubstituted $C_1$ to $C_{12}$ alkyl group, a substituted or unsubstituted $C_3$ to $C_{12}$ cycloalkyl group, a substituted or unsubstituted $C_2$ to $C_{12}$ alkenyl group, a substituted or unsubstituted $C_2$ to $C_{12}$ alkynyl group, an unsubstituted aryl group or an aryl group substituted with a $C_1$ to $C_3$ alkyl group, an unsubstituted aralkyl or an aralkyl group substituted with a $C_1$ to $C_3$ alkyl group, or a substituted or unsubstituted heterocyclic group; wherein the total carbon atom number of $R^{49}$ is 12 or less.

Formula (D-3) is shown as below:

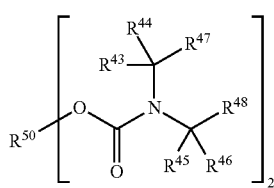

formula (D-3)

In formula (D-3), $R^{43}$ to $R^{48}$ are as defined in formula (D-2); $R^{50}$ represents a substituted or unsubstituted $C_1$ to $C_{12}$ alkylene group, a substituted or unsubstituted $C_3$ to $C_{12}$ cycloalkylene group, a substituted or unsubstituted $C_2$ to $C_{12}$ alkenylene group, a substituted or unsubstituted $C_2$ to $C_{12}$ alkynylene group, an unsubstituted arylene group or an arylene group substituted with a $C_1$ to $C_3$ alkyl group, an unsubstituted aralkylene group or an aralkylene group substituted with a $C_1$ to $C_3$ alkyl group, or a substituted or unsubstituted heterocyclic group; wherein the total carbon atom number of $R^{50}$ is 12 or less.

The preferred examples of the compounds represented by formula (D-2) and formula (D-3) include, for example, an ortho-nitrobenzyl carbamate-based such as {[(2-nitrobenzyl)oxy]carbonyl}methylamine, {[(2-nitrobenzyl)oxy]carbonyl}propylamine, {[(2-nitrobenzyl)oxy]carbonyl}hexylamine, {[(2-nitrobenzyl)oxy]carbonyl}cyclohexylamine, {[(2-nitrobenzyl)oxy]carbonyl}aniline, {[(2-nitrobenzyl)oxy]carbonyl}piperidine, bis{[(2-nitrobenzyl)oxy]carbonyl}hexamethylenediamine, bis{[(2-nitrobenzyl)oxy]carbonyl}phenylenediamine, bis{[(2-nitrobenzyl)oxy]carbonyl}toluenediamine, bis{[(2-nitrobenzyl)oxy]carbonyl}diaminodiphenylmethane, bis{[(2-nitrobenzyl)oxy]carbonyl}piperazine, {[(2,6-dinitrobenzyl)oxy]carbonyl}methylamine, {[(2,6-dinitrobenzyl)oxy]carbonyl}propylamine, {[(2,6-dinitrobenzyl)oxy]carbonyl}hexylamine, {[(2,6-dinitrobenzyl)oxy]carbonyl}cyclohexylamine, {[(2,6-dinitrobenzyl)oxy]carbonyl}aniline, bis{[(2,6-dinitrobenzyl)oxy]carbonyl}piperidine, bis{[(2,6-dinitrobenzyl)oxy]carbonyl}hexamethylenediamine, bis{[(2,6-dinitrobenzyl)oxy]carbonyl}phenylenediamine, bis{[(2,6-dinitrobenzyl)oxy]carbonyl}toluenediamine, bis{[(2,6-dinitrobenzyl)oxy]carbonyl}diaminodiphenylmethane, and bis{[(2,6-dinitrobenzyl)oxy]carbonyl}piperazine; an α,α-dimethyl-3,5-dimethoxybenzyl carbamate-based such as {[(α,α-dimethyl-3,5-dimethoxybenzyl)oxy]carbonyl}methylamine, {[(α,α-dimethyl-3,5-dimethoxybenzyl)oxy]carbonyl}propylamine, {[(α,α-dimethyl-3,5-dimethoxybenzyl)oxy]carbonyl}hexylamine, {[(α,α-dimethyl-3,5-dimethoxybenzyl)oxy]carbonyl}cyclohexylamine, {[(α,α-dimethyl-3,5-dimethoxybenzyl)oxy]carbonyl}aniline, {[(α,α-dimethyl-3,5-dimethoxybenzyl)oxy]carbonyl}piperidine, bis{[(α,α-dimethyl-3,5-dimethoxybenzyl)oxy]carbonyl}hexamethylenediamine, bis{[(α,α-dimethyl-3,5-dimethoxybenzyl)oxy]carbonyl}phenylenediamine, bis{[(α,α-dimethyl-3,5-dimethoxybenzyl)oxy]carbonyl}toluenediamine, bis{[(α,α-dimethyl-3,5-dimethoxybenzyl)oxy]carbonyl}diaminodiphenylmethane, and bis{[(α,α-dimethyl-3,5-dimethoxybenzyl)oxy]carbonyl}piperazine; and other compounds such as N-(isopropoxycarbonyl)-2,6-dimethyl piperidine, N-(isopropoxycarbonyl)-2,2,6,6-tetramethyl piperidine, N-(isopropoxycarbonyl)diisopropylamine, N-(isopropoxycarbonyl) pyrrolidine, N-(isopropoxycarbonyl)-2,5-dimethyl pyrrolidine, N-(isopropoxycarbonyl)azetidine, N-(1-ethylpropoxycarbonyl)-2,6-dimethyl piperidine, N-(1-ethylpropoxycarbonyl)-2,2,6,6-tetramethyl piperidine, N-(1-ethylpropoxycarbonyl)diisopropylamine, N-(1-ethylpropoxycarbonyl)pyrrolidine, N-(1-ethylpropoxycarbonyl)-2,5-dimethyl pyrrolidine, N-(1-ethylpropoxycarbonyl)azetidine, N-(1-propylbutoxycarbonyl)-2,6-dimethyl piperidine, N-(1-propylbutoxycarbonyl)-2,2,6,6-tetramethyl piperidine, N-(1-propylbutoxycarbonyl)diisopropylamine, N-(1-propylbutoxycarbonyl)pyrrolidine, N-(1-propylbutoxycarbonyl)-2,5-dimethyl pyrrolidine, N-(1-propylbutoxycarbonyl)azetidine, N-(cyclopentyloxycarbonyl)-2,6-dimethyl piperidine, N-(cyclopentyloxycarbonyl)-2,2,6,6-tetramethyl piperidine, N-(cyclopentyloxycarbonyl)diisopropylamine, N-(cyclopentyloxycarbonyl)pyrrolidine, N-(cyclopentyloxycarbonyl)-2,5-dimethyl pyrrolidine, N-(cyclopentyloxycarbonyl) azetidine, N-(cyclohexylcarbonyl)-2,6-dimethyl piperidine, N-(cyclohexylcarbonyl)-2,2,6,6-tetramethyl piperidine, N-(cyclohexylcarbonyl)diisopropylamine, N-(cyclohexylcarbonyl)pyrrolidine, N-(cyclohexylcarbonyl)-2,5-dimethyl pyrrolidine, N-(cyclohexylcarbonyl)azetidine, N-(tert-butoxycarbonyl)-2,6-dimethyl piperidine, N-(tert-butoxycarbonyl)-2,2,6,6-tetramethyl piperidine, N-(tert-butoxycarbonyl)diisopropylamine, N-(tert-butoxycarbonyl)pyrrolidine, N-(tert-butoxycarbonyl)-2,5-dimethyl pyrrolidine, N-(tert-butoxycarbonyl)azetidine, N-(benzyloxycarbonyl)-2,6-dimethyl piperidine, N-(benzyloxycarbonyl)-2,2,6,6-tetramethyl piperidine, N-(benzyloxycarbonyl)diisopropylamine, N-(benzyloxycarbonyl)pyrrolidine, N-(benzyloxycarbonyl)-2,5-dimethyl pyrrolidine, N-(benzyloxycarbonyl)azetidin or 1,4-bis(N,N'-diisopropylaminocarbonyloxy)cyclohexane; preferably N-(isopropoxycarbonyl)-2,6-dimethyl piperidine, N-(1-ethylpropoxycarbonyl)diisopropylamine, N-(cyclopentyloxycarbonyl)-2,6-dimethyl piperidine, N-(benzyloxycarbonyl)pyrrolidine or 1,4-bis(N,N-diisopropylaminocarbonyloxy)cyclohexane.

Other thermal base generator includes, for example, 2-nitrobenzyl cyclohexylcarbamate or O-carbamoylhydroxyamines amide.

Based on a usage amount of 100 parts by weight of the complex resin (A), the usage amount of the thermal generator (D) is 0.5 parts by weight to 6 parts by weight; preferably 0.7 parts by weight to 4.5 parts by weight; and more preferably 1 part by weight to 3 parts by weight.

In the case that the photosensitive resin composition contains the thermal generator (D), chemical resistance of the photosensitive resin composition can be further improved.

Additive (E)

The photosensitive resin composition of the invention can further include an additive (E). The additive (E) can be, for example, a sensitizer, an adhesion auxiliary agent, a surfactant, a solubility promoter, a defoamer, or a combination thereof.

The sensitizer is not particularly limited. The sensitizer preferably includes a compound containing a phenolic hydroxyl group, including: a trisphenol type compound, a bisphenol type compound, a polynuclear branched compound, a condensation type phenol compound, a polyhydroxy benzophenone-based, or a combination thereof.

The trisphenol type compound is, for example, tris(4-hydroxyphenyl) methane, bis(4-hydroxy-3-methylphenyl)-2-hydroxyphenyl methane, bis(4-hydroxy-2,3,5-trimethylphenyl)-2-hydroxyphenyl methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-methylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis(5-cyclohexyl-4-hydroxy-2-methylphenyl)-4-hydroxyphenyl methane, bis(5-cyclohexyl-4-hydroxy-2-methylphenyl)-3-hydroxyphenyl methane, bis(5-cyclohexyl-4-hydroxy-2-methylphenyl)-2-hydroxyphenyl methane or bis(5-cyclohexyl-4-hydroxy-2-methylphenyl)-3,4-dihydroxyphenyl methane, etc.

The bisphenol type compound is, for example, bis(2,3,4-trihydroxyphenyl) methane, bis(2,4-dihydroxyphenyl) methane, 2,3,4-trihydroxyphenyl-4'-hydroxyphenyl methane, 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, 2-(3-fluoro-4-hydroxyphenyl)-2-(3'-fluoro-4'-hydroxyphenyl) propane, 2-(2,4-dihydroxyphenyl)-2-(4'-hydroxyphenyl) propane, 2-(2,3,4-trihydroxyphenyl)-2-(4'-hydroxyphenyl) propane or 2-(2,3,4-trihydroxyphenyl)-2-(4'-hydroxy-3',5'-dimethylphenyl) propane, etc.

The polynuclear branched compound is, for example, 1-[1-(4-hydroxyphenyl)isopropyl]-4-[1,1-bis(4-hydroxyphenyl) ethyl] benzene or 1-[1-(3-methyl-4-hydroxyphenyl) isopropyl]-4-[1,1-bis(3-methyl-4-hydroxyphenyl) ethyl] benzene, etc.

The condensation type phenol compound is, for example, 1,1-bis(4-hydroxyphenyl) cyclohexane, etc.

The polyhydroxy benzophenone-based is, for example, 2,3,4-trihydroxy benzophenone, 2,4,4'-trihydroxy benzophenone, 2,4,6-trihydroxy benzophenone, 2,3,4-trihydroxy-2'-methylbenzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3,4,2',5'-pentahydroxy benzophenone, 2,4,6,3',4',5'-hexahydroxy benzophenone or 2,3,4,3',4',5'-hexahydroxy benzophenone, etc.

Based on a usage amount of 100 parts by weight of the complex resin (A), the usage amount of the sensitizer is 5 parts by weight to 50 parts by weight; preferably 8 parts by weight to 40 parts by weight; and more preferably 10 parts by weight to 35 parts by weight.

Specific examples of the adhesion auxiliary agent can be a melamine compound and a silane-based compound, etc. The role of the adhesion auxiliary agent is to increase the adhesion between the element or substrate and the protective film formed by the photosensitive resin composition.

Specific examples of commercially available products of the melamine compound include: the products manufactured by Mitsui Chemicals, trade names Cymel 300, Cymel-303, etc.; or the products manufactured by Sanwa Chemical, trade names MW-30MH, MW-30, MS-11, MS-001, MX-750 or MX-706, etc.

When using the melamine compound as the adhesion auxiliary agent, based on a usage amount of 100 parts by weight of the complex resin (A), the usage amount of the melamine compound is 0 part by weight to 20 parts by weight; preferably 0.5 parts by weight to 18 parts by weight; and more preferably 1 part by weight to 15 parts by weight.

Specific examples of the silane-based compound include: vinyl trimethoxy silane, vinyl triethoxy silane, 3-acryloyloxy-propyl-trimethoxy silane, vinyl tris(2-methoxyethoxy) silane, N-(2-aminoethyl)-3-aminopropyl methyl dimethoxy silane, N-(2-aminoethyl)-3-aminopropyl trimethoxy silane, 3-aminopropyl triethoxy silane, 3-glycidoxypropyl trimethoxy silane, 3-glycidoxypropyl dimethyl methoxy silane, 2-(3,4-epoxycyclohexyl)ethyl trimethoxy silane, 3-chloropropyl methyl dimethoxy silane, 3-chloropropyl trimethoxy silane, 3-methacryloxypropyl trimethoxy silane, 3-mercaptopropyl trimethoxy silane, or a commercially available product manufactured by Shin-Etsu Chemical Company (trade name of KBM403), etc.

When using the silane-based compound as the adhesion auxiliary agent, based on a usage amount of 100 parts by weight of the complex resin (A), the usage amount of the silane-based compound is 0 part by weight to 2 parts by weight; preferably 0.05 parts by weight to 1 part by weight; and more preferably 0.1 parts by weight to 0.8 parts by weight.

Specific examples of the surfactant can be an anionic-based surfactant, a cationic-based surfactant, a nonionic-based surfactant, an amphoteric surfactant, a polysiloxane-based surfactant, a fluorine-based surfactant or a combination thereof.

Examples of the surfactant include (1) polyoxyethylene alkyl ether-based: polyoxyethylene lauryl ether, etc.; (2) polyoxyethylene phenyl ether-based: polyoxyethylene octyl phenyl ether, polyoxyethylene nonyl phenyl ether, etc.; (3) polyethylene glycol diester-based: polyethylene glycol dilaurate, polyethylene glycol distearate, etc.; (4) sorbitan fatty acid ester-based; and (5) fatty acid modified poly ester-based; and (6) tertiary amine modified polyurethane-based. Specific examples of commercially available products of the surfactant are KP (manufactured by Shin-Etsu Chemical), SF-8427 (manufactured by Toray Dow Corning Silicone Co., Ltd.), Polyflow (manufactured by Kyoeisha Grease Chemical), F-Top (manufactured by Tochem Products Co., Ltd.), Megaface (manufactured by Dainippon ink chemical industry (DIC)), Fluorade (by Sumitomo 3M Co., Ltd.), Surflon (manufactured by Asahi Glass), SINOPOL E8008 (Sino Japan Chemical Co. Ltd.), F-475 (manufactured by Dainippon ink chemical industry) or a combination thereof.

Based on a usage amount of 100 parts by weight of the complex resin (A), the usage amount of the surfactant is 0.5 parts by weight to 50 parts by weight; preferably 1 part by weight to 40 parts by weight; and more preferably 3 parts by weight to 30 parts by weight.

Specific examples of the defoamer include Surfynol MD-20, Surfynol MD-30, EnviroGem AD01, EnviroGem AE01, EnviroGem AE02, Surfynol DF110D, Surfynol 104E, Surfynol 420, Surfynol DF37, Surfynol DF58, Surfynol DF66, Surfynol DF70 and Surfynol DF210 (manufactured by Air products), etc.

Based on a usage amount of 100 parts by weight of the complex resin (A), the usage amount of the defoamer is 1 part by weight to 10 parts by weight; preferably 2 parts by weight to 9 parts by weight; and more preferably 3 parts by weight to 8 parts by weight.

Specific examples of the solubility promoter include N-hydroxydicarboxylic imide and a compound containing phenolic hydroxyl group. Specific examples of the solubility promoter are the compound containing phenolic hydroxyl group used in the o-naphthoquinone diazide sulfonate (B).

Based on a usage amount of 100 parts by weight of the complex resin (A), the usage amount of the solubility promoter is 1 part by weight to 20 parts by weight; preferably 2 parts by weight to 15 parts by weight; and more preferably 3 parts by weight to 10 parts by weight.

The photosensitive resin composition of the invention may be prepared in the following manner: placing the complex resin (A), the o-naphthoquinone diazide sulfonate (B) and the solvent (C) in a blender and stirring them until homogeneously mixed into a solution state. If necessary, the thermal generator (D) and the additive (E) may be added.

<Manufacturing Method of Protective Film>

The invention provides a protective film formed by the photosensitive resin composition. Manufacturing method thereof is described in detail below.

The manufacturing method of protective film sequentially comprises: using a photosensitive resin composition to form a pre-baked coating film, pattern-exposing of the pre-baked coating film, removing the unexposed region by an alkali developer to form a pattern, and performing a post-baking treatment to form the protective film.

—Forming a Pre-Baked Coating Film—

By coating method such as spin coating, cast coating, or roll coating, the photosensitive resin composition in the above solution state is coated onto the element to be protected (hereinafter referred to as substrate), to form a coating film.

The substrate may be alkali-free glass, soda lime glass, hard glass (Pyrex glass), quartz glass, or such glasses adhered with a transparent conductive film used in a liquid crystal display element, or a substrate (such as, silicon substrate) used in a photoelectric conversion apparatus (such as a solid-state imaging apparatus).

After forming the coating film, most of the organic solvent in the photosensitive resin composition is removed by reducing pressure and drying method, then all the residual organic solvent is completely removed by pre-baking method, to form a pre-baked coating film.

The operation condition of the reducing pressure and drying and the pre-baking may be different according to the species and ratio of components. Generally, the reducing pressure and drying is conducted at a pressure of 0 Torr to 200 Torr for 1 second to 60 seconds, and the pre-baking is conducted at a temperature between 70° C. to 110° C. for 1 minute to 15 minutes.

—Pattern-Exposing—

A mask having a specific pattern is used to perform exposure to the pre-baked coating film. The light used in the exposure process is preferably ultraviolet (UV) rays such as g line, h line, i line, etc., and the apparatus used to provide UV rays may be an (ultra) high-pressure mercury lamp or a metal halide lamp.

—Developing—

Unnecessary portions of the exposed pre-baked coating film are removed by immersing the exposed pre-baked coating film in a developer at a temperature between 23±2° C. and developing for about 15 seconds to 5 minutes, so as to form a semi-finished product of the protective film with a predetermined pattern on the substrate. The developer may be an alkaline compound such as, sodium hydroxide, potassium hydroxide, sodium carbonate, sodium bicarbonate, potassium carbonate, potassium bicarbonate, sodium silicate, sodium methylsilicate, aqueous ammonia, ethylamine, diethylamine, dimethyl ethanolamine, tetramethylammonium hydroxide (THAM), tetraethylammonium hydroxide, choline, pyrrole, piperidine or 1,8-diaza-bicyclo-(5,4,0)-7-undecene, etc.

It is noted that if the concentration of the developer is too high, the specific pattern may be damaged or the resolution of the specific pattern may be deteriorated. If the concentration of the developer is too low, poor development may happen, the specific pattern may not be formed or residues of the composition remain in exposed portions. Therefore, the concentration of the developer affects the formation of the specific pattern of the subsequent photosensitive resin composition after exposure. The concentration range of the developer is preferably 0.001 wt % to 10 wt %; more preferably 0.005 wt % to 5 wt %; further more preferably 0.01 wt % to 1 wt %. The embodiment of the invention employs a developer of 2.38 wt % tetramethylammonium hydroxide. It is noted that even using a lower concentration of the developer, the photosensitive resin composition of the invention is capable of forming a good fine pattern.

—Post-Baking Treatment—

The substrate (semi-finished product of the protective film with the predetermined pattern on the substrate) is washed with water to remove the unnecessary portions of the exposed pre-baked coating film. Then, compressed air or compressed nitrogen is used to dry up the semi-finished product of the protective film with the predetermined pattern. Finally, the semi-finished product of the protective film with the predetermined pattern is post-baked by a heating device such as a heating plate or an oven. The heating temperature is set between 100° C. to 250° C., and the heating time with the heating plate is 1 minute to 60 minutes or the heating time with the oven is 5 minutes to 90 minutes. Thereby, the semi-finished product of the protective film with the predetermined pattern is cured to form a protective film.

<Manufacturing Method of Liquid Crystal Display Element>

The invention provides a liquid crystal display element containing the protective film. Manufacturing method thereof is described in detail below.

First, an element including the protective film (such as a color filter) formed by the above mentioned manufacturing method of the protective film and a substrate provided with a thin film transistor (TFT) are disposed opposite to each other, and a gap (cell gap) is left between the two. Then, the element and the peripheral portion of the substrate are laminated with an adhesive and an injection hole is left. Then, liquid crystal is injected into the gap separated by the substrate surface and the adhesive through the injection hole. Lastly, the injection hole is sealed to form a liquid crystal layer. Then, a polarizer is provided to each of the other side of the element in contact with the liquid crystal layer and the other side of the substrate in contact with the liquid crystal layer to fabricate the liquid crystal display element. The liquid crystal used, i.e., a liquid crystal compound or a liquid crystal composition, is not particularly limited. Any liquid crystal compound or liquid crystal composition can be used.

Moreover, a liquid crystal alignment film used in the fabrication of the color filter is used to limit the alignment of the liquid crystal molecules and is not particularly limited. Both inorganic matter and organic matter can be used, and the invention is not limited thereto.

The following examples are used to further describe the invention. However, it should be understood that, the examples are only exemplary, and are not intended to limit the implementation of the invention.

EXAMPLES

Synthesis Examples of Complex Resin (A)

In the following, synthesis example A1 to synthesis example A13 and comparative synthesis example A'1 to comparative synthesis example A'3 of the complex resin (A) are described:

Further, the compounds corresponding to the abbreviations in the following synthesis examples are as shown below.

Abbreviation Component
MAA methacrylic acid
AA acrylic acid
HOMS 2-methacryloyloxyethyl succinate
MPTMS 3-methacryloxypropyltrimethoxysilane
MPTES 3-methacryloxypropyltriethoxysilane
FM-0711 siloxane (meth)acrylate based monomer (manufactured by Chisso Corporation)
MMA methyl methacrylate
GMA glycidyl methacrylate
HEMA hydroxyethyl methacrylate
FA513M tricyclodecanyl methacrylate
BzMA benzyl methacrylate
SM styrene
GF-20 3-(triethoxysilyl) propyl succinic anhydride
X-12-967 3-(trimethoxysilyl) propyl succinic anhydride
TMSG 3-(trimethoxysilyl) propyl glutaric anhydride
GPTMS (3-glycidoxypropyl)trimethoxysilane
TMSOX-D (2-oxetanylbutoxypropyl)trimethoxysilane
ECHETS 2-(3,4-epoxycyclohexyl)ethyltrimethoxysilane
MTMS methyltrimethoxy silane
DMDMS dimethyldimethoxysilane
PTMS phenyltrimethoxysilane
PTES phenyltriethoxysilane
ADVN 2,2'-Azobis(2,4-dimethylvaleronitrile)
AMBN 2,2'-Azobis(2-methylbutyronitrile)
PGEE propylene glycol monoethyl ether
DAA diacetone alcohol
PGMEA propylene glycol methyl ether acetate Synthesis Example A1

Step 1: As synthesis example A1 shown in Table 1, a nitrogen inlet, a stirrer, a heater, a condenser tube, and a thermometer were provided to a four-necked flask having a volume of 1000 ml. After nitrogen was introduced, 10 parts by weight of MPTMS (equivalent to the siloxane (meth) acrylate based monomer (a1-2)), 90 parts by weight of MMA (equivalent to the other unsaturated monomer (a1-3)), 2.4 parts by weight of ADVN, and 290 parts by weight of PGMEA were added into the reacting bottle. Then, the mixture was slowly stirred and the solution was heated to 80° C., and polymerization was performed for 3 hours. Then, after the solvent was evaporated, the main chain copolymer (A-1-1) was obtained.

Step 2: As synthesis example A1 shown in Table 2, 10 parts by weight of GF-20 (equivalent to the monomer (a2-1)), 50 parts by weight of MTMS (equivalent to the monomer (a2-2)), 40 parts by weight of PTMS (equivalent to the monomer (a2-2)) and 80 parts by weight of DAA were added into a 500 ml three-necked flask, and an aqueous phosphoric acid solution (0.1 parts by weight of phosphoric acid/30 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the side chain polycondensate (A-2-1).

Step 3: As synthesis example A1 shown in Table 3, 20 parts by weight of solid component of the main chain copolymer (A-1-1) and 80 parts by weight of solid component of the side chain polycondensate (A-2-1) obtained in the above synthesis were mixed in a mixed solvent of 60 parts by weight of PGMEA and 65 parts by weight of DAA in a 1000 ml three-necked flask. An aqueous phosphoric acid solution (0.05 parts by weight of phosphoric acid/4 parts by weight of deionized water) was added at room temperature with stirring within 30 minutes. Next, the flask was immersed in an oil bath and stirred at 80° C. for 120 minutes. Then, the temperature was raised to 105° C. After polymerization was conducted under stirring for 120 minutes, the solvent was removed by distillation to obtain the complex resin (A1).

Synthesis Example A2 to Synthesis Example A7

As shown in Table 1 to Table 3, complex resins of Synthesis example A2 to Synthesis example A7 were obtained by the same steps as in Synthesis example A1, and the difference thereof is: the types and the usage amounts of the components were changed.

TABLE 1

| | | | Synthesis example | | | | | | |
|---|---|---|---|---|---|---|---|---|---|
| | | | A1 | A2 | A3 | A4 | A5 | A6 | A7 |
| | | | Main chain copolymer | | | | | | |
| | | | A-1-1 | A-1-2 | A-1-3 | A-1-4 | A-1-5 | A-1-6 | A-1-7 |
| Monomer for polymerization (parts by weight) | a1-1 | MAA | — | — | — | 10 | — | — | — |
| | | AA | — | — | — | — | — | 20 | 20 |
| | | HOMS | — | — | — | — | 30 | — | 20 |
| | a1-2 | MPTMS | 10 | — | — | — | 10 | — | — |
| | | MPTES | — | — | 40 | 30 | — | 10 | 5 |
| | | FM-0711 | — | 50 | — | — | 10 | — | — |
| | a1-3 | MMA | 90 | 10 | — | — | 10 | 30 | 30 |
| | | GMA | — | — | — | 10 | — | — | — |
| | | HEMA | — | — | 10 | — | 10 | 5 | 5 |
| | | FA513M | — | — | 20 | — | 30 | — | — |
| | | BzMA | — | 20 | — | 30 | — | 35 | — |
| | | SM | — | 20 | 30 | 20 | — | — | 20 |
| Solvent (parts by weight) | | Diglyme | — | 150 | — | — | 200 | — | — |
| | | PGMEA | 290 | 150 | 320 | 320 | 100 | 300 | 300 |
| Catalyst (parts by weight) | | AMBN | — | 2.5 | — | 1 | 2.4 | — | — |
| | | ADVN | 2.4 | — | 2.3 | 1.3 | — | 2.3 | 2.3 |
| Polymerization temperature (° C.) | | | 80 | 80 | 75 | 75 | 85 | 75 | 75 |
| Polymerization time (hour) | | | 2 | 2 | 3 | 3 | 2 | 3 | 3 |

TABLE 2

| | | | Synthesis example | | | | | | |
|---|---|---|---|---|---|---|---|---|---|
| | | | A1 | A2 | A3 | A4 | A5 | A6 | A7 |
| | | | Side chain polycondensate | | | | | | |
| | | | A-2-1 | A-2-2 | A-2-3 | A-2-4 | A-2-5 | A-2-6 | A-2-7 |
| silane monomer for polymerization (parts by weight) | a2-1 | GF-20 | 10 | — | — | — | — | — | — |
| | | X-12-967 | — | — | 20 | — | — | — | — |
| | | TMSG | — | — | — | — | — | 5 | — |
| | | GPTMS | — | 20 | — | — | — | — | — |
| | | TMSOX-D | — | — | — | — | — | — | 40 |
| | | ECHETS | — | 10 | — | — | — | — | — |
| | a2-2 | MTMS | 50 | — | 40 | 50 | — | 65 | 30 |
| | | DMDMS | — | 30 | — | — | 40 | — | — |
| | | PTMS | 40 | — | 20 | — | 60 | 30 | 30 |
| | | PTES | — | 50 | 10 | 50 | — | — | — |
| Solvent (parts by weight) | | PGEE | — | 85 | 10 | — | 80 | — | — |
| | | DAA | 80 | — | 70 | 75 | — | 80 | 80 |
| Catalyst (parts by weight) | | water | 30 | 30 | 30 | 35 | 30 | 30 | 30 |
| | | Phosphoric acid | 0.1 | 0.15 | 0.1 | 0.1 | 0.1 | 0.15 | 0.15 |

TABLE 2-continued

| | Synthesis example | | | | | | |
|---|---|---|---|---|---|---|---|
| | A1 | A2 | A3 | A4 | A5 | A6 | A7 |
| | Side chain polycondensate | | | | | | |
| | A-2-1 | A-2-2 | A-2-3 | A-2-4 | A-2-5 | A-2-6 | A-2-7 |
| Polymerization temperature (° C.) | 105 | 110 | 105 | 105 | 100 | 105 | 105 |
| Polycondensation time (hour) | 80 | 60 | 80 | 80 | 100 | 80 | 80 |

TABLE 3

| | | Synthesis example | | | | | | |
|---|---|---|---|---|---|---|---|---|
| | | A1 | A2 | A3 | A4 | A5 | A6 | A7 |
| Main chain copolymer | Species | A-1-1 | A-1-2 | A-1-3 | A-1-4 | A-1-5 | A-1-6 | A-1-7 |
| (solid component) | parts by weight | 20 | 10 | 5 | 25 | 20 | 15 | 30 |
| Side chain polycondensate | Species | A-2-1 | A-2-2 | A-2-3 | A-2-4 | A-2-5 | A-2-6 | A-2-7 |
| (solid component) | parts by weight | 80 | 90 | 95 | 75 | 80 | 85 | 70 |
| Solvent | PGMEA | 60 | — | 130 | — | 80 | 135 | 135 |
| (parts by weight) | DAA | 65 | 120 | — | 130 | 40 | — | — |
| Catalyst | $H_2O$ | 4 | 4.5 | 4 | 4 | 4 | 4 | 4 |
| (parts by weight) | Phosphoric acid | 0.05 | 0.1 | 0.05 | 0.05 | 0.05 | 0.1 | 0.1 |
| Reaction temperature (° C.) | | 105 | 110 | 100 | 105 | 105 | 110 | 110 |
| Polycondensation time (min) | | 120 | 120 | 150 | 120 | 120 | 100 | 100 |

Synthesis Example A8

Step 1: A nitrogen inlet, a stirrer, a heater, a condenser tube, and a thermometer were provided to a four-necked flask having a volume of 1000 ml. After nitrogen was introduced, 95 parts by weight of MMA (equivalent to the other unsaturated monomer (a1-3)), 5 parts by weight of MPTMS (equivalent to the siloxane (meth)acrylate based monomer (a1-2)), 15 parts by weight of MTMS (equivalent to the monomer (a2-2)), 11 parts by weight of ADVN, and 120 parts by weight of PGMEA were added into the reacting bottle. Then, the mixture was slowly stirred and the solution was heated to 80° C., and polymerization was performed for 3 hours. Then, an aqueous phosphoric acid solution (0.2 parts by weight of phosphoric acid/4.2 parts by weight of deionized water) was added. After the solution was stirred for 1 hour, the temperature was raised to 105° C. After polycondensation was conducted under heating and stirring for 60 minutes, the solvent was evaporated, and the main chain copolymer (A-1-8) partially having polysiloxane side chain was obtained.

Step 2: 10 parts by weight of GF-20 (equivalent to the monomer (a2-1)), 40 parts by weight of PTMS (equivalent to the monomer (a2-2)), 35 parts by weight of MTMS (equivalent to the monomer (a2-2)), and 80 parts by weight of DAA were added into a 500 ml three-necked flask, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the side chain polycondensate (A-2-8).

Step 3: 20 parts by weight of solid component of the main chain copolymer (A-1-8) partially having polysiloxane side chain and 80 parts by weight of solid component of the side chain polycondensate (A-2-8) obtained in the above synthesis were mixed in a mixed solvent of 60 parts by weight of PGMEA and 65 parts by weight of DAA in a 1000 ml three-necked flask. An aqueous phosphoric acid solution (0.05 parts by weight of phosphoric acid/4 parts by weight of deionized water) was added at room temperature with stirring within 30 minutes. Next, the flask was immersed in an oil bath and stirred at 80° C. for 120 minutes. Then, the temperature was raised to 105° C. After polymerization was conducted under stirring for 120 minutes, the solvent was removed by distillation to obtain the complex resin (A8).

Synthesis Example A9

Step 1: A nitrogen inlet, a stirrer, a heater, a condenser tube, and a thermometer were provided to a four-necked flask having a volume of 1000 ml. After nitrogen was introduced, 10 parts by weight of MAA (equivalent to the unsaturated monomer (a1-1) comprising a carboxylic acid or a carboxylic anhydride), 10 parts by weight of MPTMS (equivalent to the siloxane (meth)acrylate based monomer (a1-2)), 50 parts by weight of MMA (equivalent to the other unsaturated monomer (a1-3)), 30 parts by weight of BzMA (equivalent to the other unsaturated monomer (a1-3)), 12 parts by weight of DMDMS (equivalent to the monomer (a2-2)), 11 parts by weight of ADVN, and 120 parts by weight of PGMEA were added into the reacting bottle. Then, the mixture was slowly stirred and the solution was heated to 80° C., and polymerization was performed for 3 hours. Then, an aqueous phosphoric acid solution (0.2 parts by weight of phosphoric acid/4.0 parts by weight of deionized water) was added. After the solution was stirred for 1 hour, the temperature was raised to 105° C. After polycondensation was conducted under heating and stirring for 60 minutes, the solvent was evaporated, and the main chain copolymer (A-1-9) partially having polysiloxane side chain was obtained.

Step 2: 40 parts by weight of PTMS (equivalent to the monomer (a2-2)), 38 parts by weight of MTMS (equivalent to the monomer (a2-2)), 10 parts by weight of PTES (equivalent to the monomer (a2-2)), and 80 parts by weight of DAA were added into a 500 ml three-necked flask, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the side chain polycondensate (A-2-9).

Step 3: 25 parts by weight of solid component of the main chain copolymer (A-1-9) partially having polysiloxane side chain and 75 parts by weight of solid component of the side chain polycondensate (A-2-9) obtained in the above synthesis were mixed in a mixed solvent of 60 parts by weight of PGMEA and 65 parts by weight of DAA in a 1000 ml three-necked flask. An aqueous phosphoric acid solution (0.05 parts by weight of phosphoric acid/4 parts by weight of deionized water) was added at room temperature with stirring within 30 minutes. Next, the flask was immersed in an oil bath and stirred at 80° C. for 120 minutes. Then, the temperature was raised to 105° C. After polymerization was conducted under stirring for 120 minutes, the solvent was removed by distillation to obtain the complex resin (A9).

Synthesis Example A10

Step 1: A nitrogen inlet, a stirrer, a heater, a condenser tube, and a thermometer were provided to a four-necked flask having a volume of 1000 ml. After nitrogen was introduced, 10 parts by weight of MAA (equivalent to the unsaturated monomer (a1-1) comprising a carboxylic acid or a carboxylic anhydride), 15 parts by weight of MPTMS (equivalent to the siloxane (meth)acrylate based monomer (a1-2)), 45 parts by weight of MMA (equivalent to the other unsaturated monomer (a1-3)), 20 parts by weight of BzMA (equivalent to the other unsaturated monomer (a1-3)), 10 parts by weight of SM (equivalent to the other unsaturated monomer (a1-3)), 15 parts by weight of DMDMS (equivalent to the monomer (a2-2)), 12 parts by weight of ADVN, and 130 parts by weight of PGMEA were added into the reacting bottle. Then, the mixture was slowly stirred and the solution was heated to 80° C., and polymerization was performed for 3 hours. Then, an aqueous phosphoric acid solution (0.2 parts by weight of phosphoric acid/4.5 parts by weight of deionized water) was added. After the solution was stirred for 1 hour, the temperature was raised to 105° C. After polycondensation was conducted under heating and stirring for 60 minutes, the solvent was evaporated, and the main chain copolymer (A-1-10) partially having polysiloxane side chain was obtained.

Step 2: 10 parts by weight of TMSG (equivalent to the monomer (a2-1)), 30 parts by weight of PTMS (equivalent to the monomer (a2-2)), 35 parts by weight of MTMS (equivalent to the monomer (a2-2)), 10 parts by weight of PTES (equivalent to the monomer (a2-2)), and 85 parts by weight of DAA were added into a 500 ml three-necked flask, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the side chain polycondensate (A-2-10).

Step 3: 15 parts by weight of solid component of the main chain copolymer (A-1-10) partially having polysiloxane side chain and 85 parts by weight of solid component of the side chain polycondensate (A-2-10) obtained in the above synthesis were mixed in a mixed solvent of 60 parts by weight of PGMEA and 65 parts by weight of DAA in a 1000 ml three-necked flask. An aqueous phosphoric acid solution (0.05 parts by weight of phosphoric acid/4 parts by weight of deionized water) was added at room temperature with stirring within 30 minutes. Next, the flask was immersed in an oil bath and stirred at 80° C. for 120 minutes. Then, the temperature was raised to 105° C. After polymerization was conducted under stirring for 120 minutes, the solvent was removed by distillation to obtain the complex resin (A10).

Synthesis Example A11

A nitrogen inlet, a stirrer, a heater, a condenser tube, and a thermometer were provided to a four-necked flask having a volume of 1000 ml. After nitrogen was introduced, 12 parts by weight of MPTMS (equivalent to the siloxane (meth) acrylate based monomer (a1-2)), 88 parts by weight of MMA (equivalent to the other unsaturated monomer (a1-3)), 2.4 parts by weight of ADVN, and 290 parts by weight of PGMEA were added into the reacting bottle. Then, the mixture was slowly stirred and the solution was heated to 80° C., and polymerization was performed for 3 hours. Then, 10 parts by weight of GF-20 (equivalent to the monomer (a2-1)), 40 parts by weight of PTMS (equivalent to the monomer (a2-2)), 50 parts by weight of MTMS (equivalent to the monomer (a2-2)), and 80 parts by weight of DAA were added, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the complex resin (A11).

Synthesis Example A12

A nitrogen inlet, a stirrer, a heater, a condenser tube, and a thermometer were provided to a four-necked flask having a volume of 1000 ml. After nitrogen was introduced, 20 parts by weight of MAA (equivalent to the unsaturated monomer (a1-1) comprising a carboxylic acid or a carboxylic anhydride), 15 parts by weight of MPTES (equivalent to the siloxane (meth)acrylate based monomer (a1-2)), 40 parts by weight of MMA (equivalent to the other unsaturated monomer (a1-3)), 25 parts by weight of FA513M (equivalent to the other unsaturated monomer (a1-3)), 2.5 parts by weight of ADVN, and 300 parts by weight of PGMEA were added into the reacting bottle. Then, the mixture was slowly stirred and the solution was heated to 80° C., and polymerization was performed for 3 hours. Then, 40 parts by weight of PTMS (equivalent to the monomer (a2-2)), 50 parts by weight of MTMS (equivalent to the monomer (a2-2)), 10 parts by weight of DMDMS (equivalent to the monomer (a2-2)), and 80 parts by weight of DAA were added, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the complex resin (A12).

Synthesis Example A13

A nitrogen inlet, a stirrer, a heater, a condenser tube, and a thermometer were provided to a four-necked flask having a volume of 1000 ml. After nitrogen was introduced, 10 parts by weight of MAA (equivalent to the unsaturated monomer (a1-1) comprising a carboxylic acid or a carboxylic anhydride), 15 parts by weight of MPTES (equivalent to the siloxane (meth)acrylate based monomer (a1-2)), 40 parts by weight of MMA (equivalent to the other unsaturated monomer (a1-3)), 25 parts by weight of FA513M (equivalent to the other unsaturated monomer (a1-3)), 10 parts by weight of SM, 2.5 parts by weight of ADVN, and 300 parts by weight of PGMEA were added into the reacting bottle. Then, the mixture was slowly stirred and the solution was heated to 80° C., and polymerization was performed for 3 hours. Then, 10 parts by weight of TMSG (equivalent to the monomer (a2-1)), 50 parts by weight of PTMS (equivalent to the monomer (a2-2)), 40 parts by weight of MTMS (equivalent to the monomer (a2-2)), and 80 parts by weight of DAA were added, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the complex resin (A13).

Comparative Synthesis Example A'1

A nitrogen inlet, a stirrer, a heater, a condenser tube, and a thermometer were provided to a four-necked flask having a volume of 1000 ml. After nitrogen was introduced, 10 parts by weight of MAA (equivalent to the unsaturated monomer (a1-1) comprising a carboxylic acid or a carboxylic anhydride), 10 parts by weight of MPTMS (equivalent to the siloxane (meth)acrylate based monomer (a1-2)), 30 parts by weight of methyl methacrylate (MMA, equivalent to the other unsaturated monomer (a1-3)), 50 parts by weight of BzMA (equivalent to the other unsaturated monomer (a1-3)), 2.4 parts by weight of ADVN, and 290 parts by weight of PGMEA were added into the reacting bottle. Then, the mixture was slowly stirred and the solution was heated to 80° C., and polymerization was performed for 3 hours. Then, after the solvent was evaporated, the (meth)acrylate based polymer (A'1) was obtained.

Comparative Synthesis Example A'2

10 parts by weight of GF-20 (equivalent to the monomer (a2-1)), 40 parts by weight of PTMS (equivalent to the monomer (a2-2)), 50 parts by weight of MTMS (equivalent to the monomer (a2-2)), and 80 parts by weight of DAA were added into a 500 ml three-necked flask, and an aqueous phosphoric acid solution (0.1 parts by weight of phosphoric acid/32.6 parts by weight of deionized water) was added at room temperature with stirring within 30 minutes. Next, the flask was immersed in an oil bath and the temperature was raised to 40° C. within 60 minutes, and the solution was stirred at 40° C. for 30 minutes. Then, within 90 minutes, the temperature was raised to 105° C. After polycondensation was conducted under heating and stirring for 80 minutes, the solvent was removed by distillation to obtain the polysiloxane (A'2).

Examples of Photosensitive Resin Composition

In the following, example 1 to example 14 and comparative example 1 to comparative example 5 of the photosensitive resin composition are described:

Example 1

100 parts by weight of the complex resin (A1) (hereinafter A1), 4 parts by weight of the o-naphthoquinone diazide sulfonate (hereinafter B-1) formed by 1-[1-(4-hydroxyphenyl)isopropyl]-4-[1,1-bis(4-hydroxyphenyl) ethyl] benzene and o-naphthoquinone diazide-5-sulfonic acid through reaction, and 0.5 parts by weight of N-(trifluoromethanesulfonyloxy)bicyclo[2.2.1]hept-5-ene-2,3-dicarboxylimide (hereinafter D-1), were added to 200 parts by weight of propylene glycol monomethyl ether acetate (hereinafter C-1), and the mixture was uniformly stirred via a shaking-type stirrer to obtain the photosensitive resin composition of example 1. The obtained photosensitive resin composition was evaluated by each of the following evaluation methods, and the results are as shown in Table 4.

Example 2 to Example 14

The photosensitive resin compositions of example 2 to example 14 were prepared using the same steps as example 1, and the difference thereof is: the type and the usage amount of the components of the photosensitive resin compositions were changed (as shown in Table 4). The obtained photosensitive resin compositions were evaluated by each of the following evaluation methods, and the results are as shown in Table 4.

Comparative Example 1 to Comparative Example 5

The photosensitive resin compositions of comparative example 1 to comparative example 5 were prepared using the same steps as example 1, and the difference thereof is: the type and the usage amount of the components of the photosensitive resin compositions were changed (as shown in Table 4). The obtained photosensitive resin compositions were evaluated by each of the following evaluation methods, and the results are as shown in Table 4.

The compounds corresponding to the abbreviations in Table 4 are as shown below.

| Abbreviation | Compound |
|---|---|
| A1 | Complex resin (A1) of synthesis example A1 |
| A2 | Complex resin (A2) of synthesis example A2 |
| A3 | Complex resin (A3) of synthesis example A3 |
| A4 | Complex resin (A4) of synthesis example A4 |
| A5 | Complex resin (A5) of synthesis example A5 |
| A6 | Complex resin (A6) of synthesis example A6 |
| A7 | Complex resin (A7) of synthesis example A7 |
| A8 | Complex resin (A8) of synthesis example A8 |
| A9 | Complex resin (A9) of synthesis example A9 |
| A10 | Complex resin (A10) of synthesis example A10 |
| A11 | Complex resin (A11) of synthesis example A11 |

-continued

| Abbreviation | Compound |
|---|---|
| A12 | Complex resin (A12) of synthesis example A12 |
| A13 | Complex resin (A13) of synthesis example A13 |
| A'1 | (Meth)acrylate based polymer (A'1) of comparative synthesis example A'1 |
| A'2 | Polysiloxane (A'2) of comparative synthesis example A'2 |
| B-1 | o-naphthoquinone diazide sulfonate formed by 1-[1-(4-hydroxyphenyl)isopropyl]-4-[1,1-bis(4-hydroxyphenyl) ethyl] benzene and o-naphthoquinone diazide-5-sulfonic acid through reaction |
| B-2 | o-naphthoquinone diazide sulfonate formed by 2,3,4-trihydroxybenzophenone and o-naphthoquinone diazide-5-sulfonic acid through reaction |
| B-3 | o-naphthoquinone diazide sulfonate formed by 2-(2,3,4-trihydroxyphenyl)-2-(2',3',4'-trihydroxyphenyl) propane and o-naphthoquinone diazide-5-sulfonic acid through reaction |
| C-1 | Propylene glycol methyl ether acetate (PGMEA) |
| C-2 | Diacetone alcohol (DAA) |
| C-3 | Cyclohexanone |
| D-1 | N-(trifluoromethanesulfonyloxy)bicyclo[2.2.1]hept-5-ene-2,3-dicarboxyimide (NDI-105, manufactured by Midori Kagaku Co., Ltd.) |
| D-2 | Benzyl sulfonium salt (SI-100, manufactured by Sanshin Chemical Industry Corporation (Ltd.)) |
| D-3 | Compound represented by formula (D-1) or the salt derivative thereof (U-CAT ® 5002, manufactured by Aporo Co., Ltd.) |
| E-1 | Surfactant (SF-8427, manufactured by Toray Dow Corning Silicone Co., Ltd.) |
| E-2 | 3-glycidoxypropyl trimethoxy silane (trade name: KBM403, manufactured by Shin-Etsu Chemical Company, adhesion auxiliary agent) | pre-baking at 90° C. for 2 minutes. The pre-coated films were then immersed in a developer of 2.38 wt % tetramethylammonium hydroxide solution for 60 seconds followed by washing with pure water. The coating films after developing were directly irradiated by an exposure machine with an energy intensity of 200 mJ/cm². Post-bake was then conducted at 230° C. for 1 hour. Transmittances of light with a wavelength of 400 nm to 800 nm through the baked protective films were measured by measuring the post-baked films by a transmission absorption spectrum analyzer (MCPD-Series, manufactured by Otsuka Electronics Co., Ltd.) At least 5 measuring points were measured. Obtained data were averaged and transmittance values at wavelength of 400 nm were considered to be the data of transmittance, and were evaluated according to the following standards:

⊚: 95%≤Transmittance

◯: 90%≤Transmittance<95%

Δ: 85%≤Transmittance<90%

X: Transmittance≤85%

(b) Chemical Resistance

The photosensitive resin compositions were spin-coated on raw glass substrates of 100 mm×100 mm×0.7 mm to obtain pre-coated films of 3 μm in thickness followed by pre-baking at 90° C. for 2 minutes. The pre-coated films were then immersed in a developer of 2.38 wt % tetramethylammonium hydroxide solution for 60 seconds followed by washing with pure water. The coating films after developing were directly irradiated by an exposure machine

TABLE 4

| Component | | Example | | | | | | | | | | | | | | Comparative example | | | | |
|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 1 | 2 | 3 | 4 | 5 |
| Complex resin (A) (parts by weight) | A1 | 100 | — | — | — | — | — | — | — | — | — | — | — | — | 30 | — | — | — | — | — |
| | A2 | — | 100 | — | — | — | — | — | — | — | — | — | — | — | — | — | — | — | — | — |
| | A3 | — | — | 100 | — | — | — | — | — | — | — | — | — | — | — | — | — | — | — | — |
| | A4 | — | — | — | 100 | — | — | — | — | — | — | — | — | — | — | — | — | — | — | — |
| | A5 | — | — | — | — | 100 | — | — | — | — | — | — | — | — | — | — | — | — | — | — |
| | A6 | — | — | — | — | — | 100 | — | — | — | — | — | — | — | — | — | — | — | — | — |
| | A7 | — | — | — | — | — | — | 100 | — | — | — | — | — | — | — | — | — | — | — | — |
| | A8 | — | — | — | — | — | — | — | 100 | — | — | — | — | — | 70 | — | — | — | — | — |
| | A9 | — | — | — | — | — | — | — | — | 100 | — | — | — | — | — | — | — | — | — | — |
| | A10 | — | — | — | — | — | — | — | — | — | 100 | — | — | — | — | — | — | — | — | — |
| | A11 | — | — | — | — | — | — | — | — | — | — | 100 | — | — | — | — | — | — | — | — |
| | A12 | — | — | — | — | — | — | — | — | — | — | — | 100 | — | — | — | — | — | — | — |
| | A13 | — | — | — | — | — | — | — | — | — | — | — | — | 100 | — | — | — | — | — | — |
| Other resin (A') (parts by weight) | A'1 | — | — | — | — | — | — | — | — | — | — | — | — | — | — | 100 | — | 10 | 30 | 50 |
| | A'2 | — | — | — | — | — | — | — | — | — | — | — | — | — | — | — | 100 | 90 | 70 | 50 |
| o-naphthoquinone diazide sulfonate (B) (parts by weight) | B-1 | 4 | — | — | 10 | — | — | — | — | 3 | — | — | 25 | — | — | 10 | — | — | 10 | — |
| | B-2 | — | 8 | — | — | 12 | — | 6 | — | — | 22 | — | — | 30 | — | — | 15 | — | — | — |
| | B-3 | — | — | 1 | — | 3 | 20 | — | 28 | — | — | 5 | — | — | 12 | — | — | 10 | — | 10 |
| Solvent (C) (parts by weight) | C-1 | 200 | — | — | 450 | — | 800 | — | — | 400 | — | — | 1300 | — | 500 | 500 | — | — | — | — |
| | C-2 | — | 350 | — | — | 500 | — | 300 | — | — | 700 | — | — | 1600 | — | — | 1000 | — | — | — |
| | C-3 | — | — | 100 | — | — | 150 | — | 250 | — | — | 900 | — | — | 500 | — | — | 800 | 1000 | 800 |
| Thermal generator (D) (parts by weight) | D-1 | 0.5 | — | — | — | — | — | — | — | — | — | — | — | — | — | — | — | — | — | — |
| | D-2 | — | — | 1.0 | 2.0 | — | — | — | — | — | — | — | — | — | 3.0 | — | — | — | — | — |
| | D-3 | — | — | — | — | — | 1.5 | — | — | — | — | — | — | 6.0 | — | — | — | — | — | — |
| Additive (E) (parts by weight) | E-1 | — | 0.3 | — | — | — | — | — | — | — | — | — | — | — | — | — | — | — | — | — |
| | E-2 | — | — | — | — | — | — | 0.3 | — | — | — | — | — | — | — | — | — | — | — | — |
| Evaluation Items | Transparency | ◯ | ◯ | ◯ | ◯ | ◯ | ◯ | ◯ | ◯ | ◯ | ◯ | ◯ | ◯ | ◯ | ◯ | X | ◯ | ◯ | Δ | X |
| | Chemical resistance | ⊚ | ◯ | ⊚ | ⊚ | ◯ | ⊚ | ◯ | ◯ | ◯ | ◯ | ◯ | ⊚ | ⊚ | ⊚ | ◯ | ◯ | X | X | Δ | ◯ |

Evaluation Methods (a) Transmittance

The photosensitive resin compositions were spin-coated on raw glass substrates of 100 mm×100 mm×0.7 mm to obtain pre-coated films of 3 μm in thickness followed by with an energy intensity of 200 mJ/cm². Post-bake was then conducted at 230° C. for 1 hour. The post-baked films were then immersed in N-methyl-2-pyrrolidone solution at 80° C. for 10 minutes. Variations of film thickness were calculated through the following formula:

Variation of film thickness=[(film thickness before immersion−film thickness after immersion)/film thickness before immersion]×100%

Obtained values of variation of film thickness were considered to be data of chemical resistance, and were evaluated according to the following standards:

⊚: Variation of film thickness≤3%
○: 3%<Variation of film thickness≤5%
Δ: 5%<Variation of film thickness≤6%
X: 6%<Variation of film thickness <Evaluation Results>

It can be known from Table 4 that, in comparison to the photosensitive resin composition containing the complex resin (A) (example 1 to example 14), the transparency of the photosensitive resin composition containing only the (meth) acrylate based polymer (A'1) (comparative example 1) is poor; the chemical resistance of the photosensitive resin composition containing only the polysiloxane (A'2) (comparative example 2) is poor; the transparency performance of the photosensitive resin composition containing both the (meth)acrylate based polymer (A'1) and the polysiloxane (A'2) (comparative example 3 to comparative example 5) gradually deteriorates as the content of the (meth)acrylate based polymer (A'1) increases, and the chemical resistance performance of the photosensitive resin composition containing both the (meth)acrylate based polymer (A'1) and the polysiloxane (A'2) (comparative example 3 to comparative example 5) gradually deteriorates as the content of the polysiloxane (A'2) increases. It can be known that the transparency and chemical resistance of the photosensitive resin composition is poor when the photosensitive resin composition does not contain the complex resin (A). Since the photosensitive resin composition of the invention includes the complex resin (A), the photosensitive resin composition of the invention has both the characteristics of high transparency and excellent chemical resistance.

Moreover, when the photosensitive resin composition contains the thermal generator (D) (examples 1, 3, 4, 6, 12 and 13), the chemical resistance performance of the photosensitive resin composition is better. It can be known that the chemical resistance of the photosensitive resin composition can be further improved when the photosensitive resin composition contains the thermal generator (D).

Based on the above, since the photosensitive resin composition of the invention includes the complex resin (A) having the main chain of poly (meth)acrylic acid structure and the side chain of polysiloxane structure, the problem of poor transparency and chemical resistance of the protective film can be improved, such that the protective film is suitable for a liquid crystal display element.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A photosensitive resin composition, comprising:
a complex resin (A);
an o-naphthoquinone diazide sulfonate (B); and
a solvent (C),
wherein the complex resin (A) comprises a main chain and a side chain, the main chain comprises a repeating unit derived from siloxane (meth)acrylate based monomer (a1-2); the side chain comprises a repeating unit derived via a polycondensation reaction from siloxane based monomer (a2), and is bonded to the repeating unit derived from siloxane (meth)acrylate based monomer (a1-2); the complex resin (A) satisfies at least one of the following conditions (I) and (II):

condition (I): the main chain further comprises a repeating unit derived from unsaturated monomer (a1-1) comprising a carboxylic acid or a carboxylic anhydride, the unsaturated monomer (a1-1) comprising a carboxylic acid or a carboxylic anhydride comprises either a carboxylic acid group structure and an unsaturated bond or a carboxylic anhydride group structure and an unsaturated bond;

condition (II): the siloxane based monomer (a2) comprises a monomer (a2-1) represented by the following formula (A-4),

$$Si(R^7)_w(OR^8)_{4-w} \quad \text{formula (A-4)}$$

in formula (A-4), $R^7$ represents a structure represented by the following formula (A-5), formula (A-6) or formula (A-7), or a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group, wherein at least one $R^7$ represents a structure represented by the following formula (A-5), formula (A-6) or formula (A-7); $R^8$ represents a hydrogen atom, a $C_1$ to $C_6$ hydrocarbon group, a $C_1$ to $C_6$ acyl group, or a $C_6$ to $C_{15}$ aryl group; when there are 2 or more $R^7$ or $R^8$ in the formula (A-4), each $R^7$ or $R^8$ can be the same or different; and w represents an integer of 1 to 3;

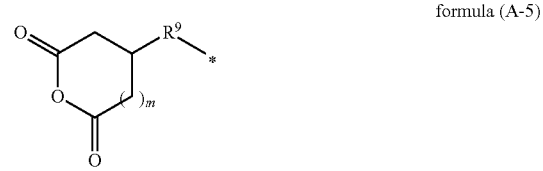

formula (A-5)

in formula (A-5), $R^9$ represents a $C_1$ to $C_{10}$ hydrocarbon group; m is 0 or 1; * represents a bonding site;

formula (A-6)

in formula (A-6), $R^{10}$ represents a single bond, a $C_1$ to $C_{10}$ alkyl group or a $C_1$ to $C_{10}$ alkoxy group; $R^{11}$ represents a hydrogen atom or a $C_1$ to $C_{10}$ hydrocarbon group; n is 0 or 1; * represents a bonding site;

formula (A-7)

in formula (A-7), $R^{12}$ represents a single bond or a $C_1$ to $C_6$ alkylene group; * represents a bonding site.

2. The photosensitive resin composition of claim 1, wherein the main chain further comprises a repeating unit derived from other unsaturated monomer (a1-3).

3. The photosensitive resin composition of claim 1, wherein the siloxane (meth)acrylate based monomer (a1-2) contains a structure of the following formula (A-1), formula (A-1)

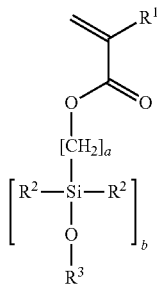

in formula (A-1), $R^1$ represents a hydrogen atom or a methyl group; a represents an integer of 1 to 6; $R^2$ each independently represents a $C_1$ to $C_{12}$ alkyl group, a phenyl group, a $C_1$ to $C_6$ alkoxy group, or a group represented by the following formula (A-2); b represents an integer of 1 to 150; $R^3$ represents a $C_1$ to $C_6$ alkyl group or a group represented by the following formula (A-3); when there are plural repeating units derived from the formula (A-1) in the main chain, each repeating unit derived from the formula (A-1) can be the same or different;

formula (A-2)

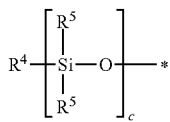

in formula (A-2), $R^4$ and $R^5$ each independently represents a $C_1$ to $C_{12}$ alkyl group or a phenyl group; c represents an integer of 2 to 13;

formula (A-3)

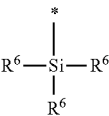

in formula (A-3), $R^6$ each independently represents a $C_1$ to $C_{12}$ alkyl group or a phenyl group.

4. The photosensitive resin composition of claim 1, wherein the siloxane based monomer (a2) further comprises a monomer (a2-2) represented by the following formula (A-8), $$Si(R^{13})_x(OR^{14})_{4-x}$$  formula (A-8)

in formula (A-8), $R^{13}$ represents a $C_1$ to $C_{10}$ hydrocarbon group, an unsubstituted phenyl group or a phenyl group of which a part of hydrogen atoms is substituted by a halogen or a $C_1$ to $C_{10}$ hydrocarbon group; $R^{14}$ represents a hydrogen atom, a $C_1$ to $C_6$ hydrocarbon group, a $C_1$ to $C_6$ acyl group, or a $C_6$ to $C_{15}$ aryl group; when there are 2 or more $R^{13}$ or $R^{14}$ in the formula (A-8), each $R^{13}$ or $R^{14}$ can be the same or different; and x represents an integer of 0 to 3.

5. The photosensitive resin composition of claim 1, wherein based on 100 parts by weight of the complex resin (A), a usage amount of the o-naphthoquinone diazide sulfonate (B) is 1 part by weight to 30 parts by weight; and a usage amount of the solvent (C) is 100 parts by weight to 1600 parts by weight.

6. The photosensitive resin composition of claim 1, further comprising a thermal generator (D).

7. The photosensitive resin composition of claim 6, wherein based on 100 parts by weight of the complex resin (A), a usage amount of the thermal generator (D) is 0.5 parts by weight to 6 parts by weight.

8. A protective film formed by the photosensitive resin composition of claim 1.

9. A liquid crystal display element, comprising the protective film of claim 8.

* * * * *